United States Patent
Zhou et al.

(10) Patent No.: US 12,408,522 B2
(45) Date of Patent: Sep. 2, 2025

(54) DISPLAY SUBSTRATE AND METHOD FOR MANUFACTURING THE SAME, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yang Zhou, Beijing (CN); Yao Huang, Beijing (CN); Shun Zhang, Beijing (CN); Huijuan Yang, Beijing (CN); Yupeng He, Beijing (CN); Xin Zhang, Beijing (CN); Yu Wang, Beijing (CN); Tinghua Shang, Beijing (CN); Yiyang Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 667 days.

(21) Appl. No.: 17/619,603

(22) PCT Filed: Mar. 15, 2021

(86) PCT No.: PCT/CN2021/080875
§ 371 (c)(1),
(2) Date: Dec. 16, 2021

(87) PCT Pub. No.: WO2021/203917
PCT Pub. Date: Oct. 14, 2021

(65) Prior Publication Data
US 2023/0157096 A1 May 18, 2023

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1201* (2023.02); *H10K 59/873* (2023.02);
(Continued)

(58) Field of Classification Search
CPC ............. H10K 59/131; H10K 59/1201; H10K 59/873; H10K 59/88; H10K 59/65;
(Continued)

(56) References Cited

U.S. PATENT DOCUMENTS

| 10,937,998 B1 | 3/2021 | Zhang et al. |
| 2016/0202515 A1 | 7/2016 | Watanabe et al. |

(Continued)

OTHER PUBLICATIONS

Extended European Search Report for corresponding European Application No. 21783922.4, dated Aug. 29, 2023, 11 pages.
(Continued)

*Primary Examiner* — Yara B Green
*Assistant Examiner* — Akhee Sarker-Nag
(74) *Attorney, Agent, or Firm* — Dority & Manning, P.A.

(57) ABSTRACT

A display substrate has at least two wiring areas, a hole border area surrounding the wiring areas, a display area surrounding the hole border area, at least one through hole area, at least one blind hole area. The blind hole area is light-transmitting. Each through hole area and each blind hole area are both surrounded by a respective wiring area. The display substrate includes a base substrate having a through hole in each through hole area, and a driver circuit layer which includes at least one metal layer located in the display area and the wiring areas, and at least one insulating layer located in the display area, the hole border area, the
(Continued)

wiring areas, and the at least one blind hole area. The metal layer includes a plurality of signal lines arranged to avoid the at least one through hole area and the at least one blind hole area.

18 Claims, 16 Drawing Sheets

(51) Int. Cl.
*H10K 59/65* (2023.01)
*H10K 59/80* (2023.01)
*H10K 59/88* (2023.01)

(52) U.S. Cl.
CPC .............. *H10K 59/88* (2023.02); *H10K 59/65* (2023.02); *H10K 59/8731* (2023.02)

(58) Field of Classification Search
CPC ....... H10K 59/8731; G09G 2300/0819; G09G 2300/0842; G09G 2300/0861
See application file for complete search history.

(56) References Cited

U.S. PATENT DOCUMENTS

| | | | |
|---|---|---|---|
| 2017/0162637 A1* | 6/2017 | Choi | G09G 3/3225 |
| 2017/0294502 A1 | 10/2017 | Ka et al. | |
| 2019/0123066 A1 | 4/2019 | Zhan et al. | |
| 2019/0245958 A1 | 8/2019 | Cheng | |
| 2019/0319212 A1* | 10/2019 | Park | H10K 59/121 |
| 2020/0064702 A1 | 2/2020 | Yeh et al. | |
| 2020/0098843 A1 | 3/2020 | Jeon et al. | |
| 2020/0106042 A1* | 4/2020 | Won | H10K 59/8722 |
| 2020/0176539 A1* | 6/2020 | Sung | H10K 59/131 |
| 2020/0273941 A1* | 8/2020 | Cha | H10K 59/121 |
| 2021/0083023 A1 | 3/2021 | Zheng et al. | |
| 2022/0093699 A1 | 3/2022 | Liu et al. | |

OTHER PUBLICATIONS

PCT International Search Report and Written Opinion (w/ English translation) for corresponding PCT Application No. PCT/CN2020/083829, mailed Jan. 11, 2021, 18 pages.
European Office Action for corresponding Application No. 21783922.4, dated Mar. 24, 2025, 9 pages.

* cited by examiner

DISPLAY SUBSTRATE AND METHOD FOR MANUFACTURING THE SAME, AND DISPLAY APPARATUS

CROSS-REFERENCE TO RELATED APPLICATIONS

This application is a national phase entry under 35 USC 371 of International Patent Application No. PCT/CN2021/080875 filed on Mar. 15, 2021, which claims priority to International Patent Application No. PCT/CN2020/083829, filed on Apr. 8, 2020, which are incorporated herein by reference in their entirety.

TECHNICAL FIELD

The present disclosure relates to the field of display technologies, and in particular, to a display substrate and a method for manufacturing the same, and a display apparatus.

BACKGROUND

In display apparatuses, a groove or a via hole is generally formed in a flexible panel to meet users' requirements for an increasingly high screen-to-body ratio of electronic equipment products. At present, a relatively mature technology to achieve a high screen-to-body ratio of a display panel is the hole-in-display technology.

The hole-in-display technology needs to sacrifice a part of a display area of the display panel, and the sacrificed display area is used for arranging optical sensors such as cameras.

SUMMARY

In an aspect, a display substrate is provided. The display substrate includes a display area, a hole border area, at least two wiring areas, at least one through hole area, and at least one blind hole area. Each through hole area and each blind hole area are both surrounded by a respective wiring area of the at least two wiring areas. The hole border area surrounds the wiring areas, and the display area surrounds the hole border area. The display substrate includes a base substrate and a driving circuit layer disposed on the base substrate. The base substrate is provided with a through hole in each through hole area.

The driving circuit layer includes at least one metal layer and at least one insulating layer. The at least one metal layer is located in the display area, the hole border area, and the wiring areas. The at least one metal layer includes a plurality of signal lines, and the plurality of signal lines are disposed to avoid the at least one through hole area and the at least one blind hole area. The at least one insulating layer is located in the display area, the hole border area, the wiring areas and the at least one blind hole area. The blind hole area is light-transmitting.

In some embodiments, the at least one through hole area includes two through hole areas, the at least one blind hole area includes one blind hole area, and the one blind hole area is disposed between the two through hole areas.

In some embodiments, the through hole area is in a shape of a circle or a quasi-ellipse. The blind hole area is in a shape of a rectangle, a rectangle with rounded corners, a shape formed by splicing rectangles with different widths together along a length direction thereof, or a shape formed by splicing rectangles with rounded corners with different widths together along a length direction thereof.

In some embodiments, the plurality of signal lines includes a plurality of data lines and a plurality of gate drive signal lines. The plurality of gate drive signal lines extend along a first direction as a whole; and the plurality of data lines extend along a second direction as a whole. The first direction intersects the second direction.

At least one data line includes a portion located in a wiring area and making a detour around a through hole area surrounded by the wiring area and/or a portion located in a wiring area and making a detour around a blind hole area surrounded by the wiring area; at least one gate drive signal line includes a portion located in a wiring area and making a detour around a through hole area surrounded by the wiring area and/or a portion located in a wiring area and making a detour around a blind hole area surrounded by the wiring area.

In some embodiments, the plurality of signal lines further include a plurality of initialization signal lines. The plurality of initialization signal lines extend along the first direction as a whole. At least one initialization signal line includes a portion located in a wiring area and making a detour around a through hole area surrounded by the wiring area and/or a portion located in a wiring area and making a detour around a blind hole area surrounded by the wiring area.

In some embodiments, the plurality of signal lines further include a plurality of light-emitting control signal lines. The plurality of light-emitting control signal lines extend along the first direction as a whole. At least one light-emitting control signal line includes a portion located in a wiring area and making a detour around a through hole area surrounded by the wiring area and/or a portion located in a wiring area and making a detour around a blind hole area surrounded by the wiring area. Or, at least one light-emitting control signal line includes a portion located in the display area and the hole border area, and is cut off at a position, to which the light-emitting control signal line extends along the first direction, of a through hole area and/or a blind hole area.

In some embodiments, the at least one metal layer includes a first gate layer, a second gate layer, and a source-drain metal layer; and the at least one insulating layer includes a first insulating layer, a second insulating layer, and an interlayer insulating layer. The driving circuit layer further includes a semiconductor layer, the semiconductor layer is located in the display area and the hole border area.

The semiconductor layer is disposed on a side of the base substrate. The first insulating layer is disposed on a side of the semiconductor layer away from the base substrate. The first gate layer is disposed on a side of the first insulating layer away from the base substrate. The second insulating layer is disposed on a side of the first gate layer away from the base substrate. The second gate layer is disposed on a side of the second insulating layer away from the base substrate. The interlayer insulating layer is disposed on a side of the second gate layer away from the base substrate. The source-drain metal layer is disposed on a side of the interlayer insulating layer away from the base substrate.

In some embodiments, in a case where the plurality of signal lines include a plurality of data lines, a plurality of light-emitting control signal lines, a plurality of gate drive signal lines, and a plurality of initialization signal lines, the plurality of data lines are located in the source-drain metal layer, the plurality of light-emitting control signal lines and the plurality of gate drive signal lines are located in one of the first gate layer and the second gate layer, and the plurality of initialization signal lines are located in another of the first gate layer and the second gate layer.

In some embodiments, the display substrate further includes a light-emitting device layer disposed on a side of the driving circuit layer away from the base substrate. The light-emitting device layer is located in the display area and the hole border area.

The light-emitting device layer includes: a first electrode layer, a pixel defining layer, a functional layer, and a second electrode layer. The first electrode layer is disposed on a side of the driving circuit layer away from the base substrate, and the first electrode layer includes a plurality of first electrodes. The pixel defining layer is disposed on a side of the first electrode layer away from the base substrate, the pixel defining layer is provided with a plurality of openings therein, and each opening exposes at least a portion of a first electrode. The functional layer is disposed on a side of the first electrode layer away from the base substrate; the functional layer includes a plurality of light-emitting portions, and each light-emitting portion is located in an opening. The second electrode layer is disposed on a side of the functional layer and the pixel defining layer away from the base substrate.

The driving circuit layer includes a plurality of pixel circuits and a plurality of redundant pixel circuits. The display area is provided with a plurality of pixel structures therein, and each pixel structure includes a pixel circuit of the plurality of pixel circuits and a light-emitting device. The light-emitting device includes a first electrode electrically connected to the pixel circuit, a first light-emitting portion in the plurality of light-emitting portions, and a portion of the second electrode layer corresponding to the first light-emitting portion.

The hole border area is provided with a plurality of redundant pixel structures therein, and each redundant pixel structure includes a redundant pixel circuit of the plurality of redundant pixel circuits and/or a redundant light-emitting device. The redundant light-emitting device includes a second light-emitting portion in the plurality of light-emitting portions and a portion of the second electrode layer corresponding to the second light-emitting portion. Or, the redundant light-emitting device includes a first electrode, a second light-emitting portion in the plurality of light-emitting portions, and a portion of the second electrode layer corresponding to the second light-emitting portion, and the first electrode is not electrically connected to the redundant pixel circuit.

In some embodiments, each redundant pixel structure includes the redundant pixel circuit. The pixel circuit and the redundant pixel circuit both include at least one thin film transistor. Each thin film transistor includes an active layer, a gate, a source, and a drain.

The active layer is located in the semiconductor layer, the gate is located in the first gate layer, and the source and the drain are located in the source-drain metal layer. The hole border area includes a first sub-area proximate to a wiring area, and a second sub-area apart from the first sub-area.

The display substrate further includes a plurality of via holes disposed in the second sub-area of the hole border area and a plurality of redundant via holes disposed in the first sub-area of the hole border area. Each via hole penetrates the first insulating layer, the second insulating layer and the interlayer insulating layer. The plurality of redundant pixel circuits are disposed in the second sub-area of the hole border area, and the source and the drain of each thin film transistor in the plurality of redundant pixel circuits are electrically connected to the active layer thereof through two via holes. Each redundant via hole penetrates the first insulating layer, the second insulating layer, and the interlayer insulating layer.

The display substrate further includes a planarization layer disposed between the driving circuit layer and the light-emitting device layer. The planarization layer is located in the display area, the hole border area, the wiring areas, and the at least one blind hole area. Portions of the planarization layer fill the plurality of redundant via holes.

In some embodiments, the display substrate further has at least one encapsulation dam area. Each encapsulation dam area is located between a through hole area and a wiring area surrounding the through hole area, and surrounds the through hole area. The first insulating layer, the second insulating layer, and the interlayer insulating layer are further located in the at least one encapsulation dam area.

The display substrate further includes one or more encapsulation dams. Each encapsulation dam area is provided with at least one encapsulation dam therein. The encapsulation dam surrounds the through hole area, and the encapsulation dam is disposed on a side of the driving circuit layer away from the base substrate. The at least one encapsulation dam includes one encapsulation dam. Or, the at least one encapsulation dam includes at least two encapsulation dams, the at least two encapsulation dams are disposed along a radial direction of the through hole area at intervals in sequence.

In some embodiments, the at least two encapsulation dams provided in each encapsulation dam area includes a first encapsulation dam and a second encapsulation dam, and the first encapsulation dam is located on a side of the second encapsulation dam away from the through hole area. A thickness of the second encapsulation dam in a third direction is greater than a thickness of the first encapsulation dam in the third direction. The third direction is perpendicular to the base substrate.

The second encapsulation dam includes a first portion, a second portion and a first spacer. The first portion is disposed in a same layer as the planarization layer. The second portion is disposed on a side of the first portion away from the base substrate, and the second portion is disposed in a same layer as the pixel defining layer. The first spacer is disposed on a side of the second portion away from the base substrate.

The first encapsulation dam includes a third portion and a second spacer. The third portion is disposed in a same layer as the pixel defining layer; the second spacer is disposed on a side of the third portion away from the base substrate, and the second spacer is made of a same material and disposed in a same layer as the first spacer.

In some embodiments, the display substrate further has at least one first isolation area and at least one second isolation area. The first insulating layer, the second insulating layer, and the interlayer insulating layer are further located in the at least one first isolation area and the at least one second isolation area.

Each first isolation area is located between a wiring area and an encapsulation dam area, and surrounds the encapsulation dam area; and each second isolation area is located between a through hole area and the encapsulation dam area, and surrounds the through hole area.

The display substrate further includes one or more first isolation pillars and one or more second isolation pillars. Each first isolation area is provided with at least one first isolation pillar therein. Each first isolation pillar is disposed to surround the first encapsulation dam, and is disposed on the side of the interlayer insulating layer away from the base substrate. A side wall of each first isolation pillar is provided with a first groove. Each second isolation area is provided with at least one second isolation pillar therein. Each second isolation pillar is disposed to surround the through hole area, and is disposed on the side of the interlayer insulating layer away from the base substrate. A side wall of each second isolation pillar is provided with a second groove.

In some embodiments, the at least one first isolation pillar and the at least one second isolation pillar are located in the source-drain metal layer.

In some embodiments, each first isolation pillar and each second isolation pillar both include a first metal pattern, a second metal pattern, and a third metal pattern that are sequentially stacked. An outer boundary of an orthographic projection of the second metal pattern on the base substrate is located within outer boundaries of orthographic projections of the first metal pattern and the third metal pattern on the base substrate, so as to form the first groove on the side wall of each first isolation pillar and the second groove on the side wall of each second isolation pillar.

In some embodiments, each second isolation area is further provided with at least one fourth metal pattern and at least one fifth metal pattern. The fourth metal pattern is located in the first gate layer, and the fifth metal pattern is located in the second gate layer. Each fourth metal pattern and each fifth metal pattern surround the through hole area. Orthographic projections of a second isolation pillar, a fourth metal pattern corresponding to the second isolation pillar, and a fifth metal pattern corresponding to the second isolation pillar on the base substrate have a common overlapping area.

In some embodiments, in a case where each first isolation area is provided with at least two first isolation pillars therein, the at least two first isolation pillars are disposed along the radial direction of the through hole area at intervals in sequence. A portion, located between two adjacent first isolation pillars, of the driving circuit layer has a slot, and the slot exposes the base substrate.

In a case where each second isolation area is provided with at least two second isolation pillars therein, the at least two second isolation pillars are disposed along the radial direction of the through hole area at intervals in sequence. A portion, located between two adjacent second isolation pillars, of the driving circuit layer has a recess.

In some embodiments, the display substrate further includes an encapsulation layer disposed on a side of the light-emitting device layer away from the base substrate.

The encapsulation layer includes a first inorganic encapsulation film layer, an organic encapsulation film layer and a second inorganic encapsulation film layer. The first inorganic encapsulation film layer is disposed on the side of the light-emitting device layer away from the base substrate; and the first inorganic encapsulation film layer is located in the at least one second isolation area, the at least one encapsulation dam area, the at least one first isolation area, the wiring areas, the hole border area, the display area, and the at least one blind hole area. The organic encapsulation film layer is disposed on a side of the first inorganic encapsulation film layer away from the base substrate; and the organic encapsulation film layer is located in the at least one encapsulation dam area, the at least one first isolation area, the wiring areas, the hole border area, the display area and the at least one blind hole area. The second inorganic encapsulation film layer is disposed on a side of the organic encapsulation film layer away from the base substrate; and the second inorganic encapsulation film layer is located in the at least one second isolation area, the at least one encapsulation dam area, the at least one first isolation area, the wiring areas, the hole border area, the display area and the at least one blind hole area.

In another aspect, a display apparatus is provided. The display apparatus includes the display substrate as described in any one embodiment of the above aspect, and at least one first sensor and at least one second sensor. Each first sensors is disposed in a through hole area; and each second sensor is disposed in a blind hole area.

In some embodiments, the at least one first sensor includes a camera, and the at least one second sensor includes at least one of an infrared sensor, a proximity optical sensor, a flood illuminator, or an ambient light sensor.

In yet another aspect, a method for manufacturing a display substrate is provided. The method includes: providing an initial base substrate, the initial base substrate including a display area, a hole border area, at least two wiring areas, at least one through hole area, and at least one blind hole area, each through hole area and each blind hole area being both surrounded by a respective wiring area of the at least two wiring areas, the hole border area surrounding the wiring areas, and the display area surrounding the hole border area;

forming a driving circuit layer to be processed on the initial base substrate, the driving circuit layer to be processed including at least one metal layer to be processed and at least one insulating layer to be processed, the at least one metal layer to be processed being at least located in the display area, the hole border area and the wiring areas, the at least one metal layer to be processed including a plurality of signal lines disposed to avoid the at least one through hole area and the at least one blind hole area, the at least one insulating layer to be processed being located in the display area, the hole border area, the wiring areas, the at least one through hole area, and the at least one blind hole area;

forming a planarization layer to be processed on a side of the driving circuit layer to be processed away from the initial base substrate, the planarization layer to be processed being located in the display area, the hole border area, the wiring areas, the at least one through hole area, and the at least one blind hole area; forming a light-emitting device layer on a side of the planarization layer to be processed away from the initial base substrate, the light-emitting device layer at least being located in the display area and the hole border area;

forming an encapsulation layer to be processed on a side of the light-emitting device layer away from the initial base substrate, the encapsulation layer to be processed being located in the display area, the hole border area, the wiring areas, the at least one through hole area and the at least one blind hole area; and removing portions, located in the at least one through hole area, of the initial base substrate, the driving circuit layer to be processed, the planarization layer to be processed, and the encapsulation layer to be processed, so as to form a base substrate, a driving circuit layer, a planarization layer and an encapsulation layer.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on actual sizes of products, actual processes of methods and actual timings of signals involved in the embodiments of the present disclosure.

DETAILED DESCRIPTION

Figure 1:
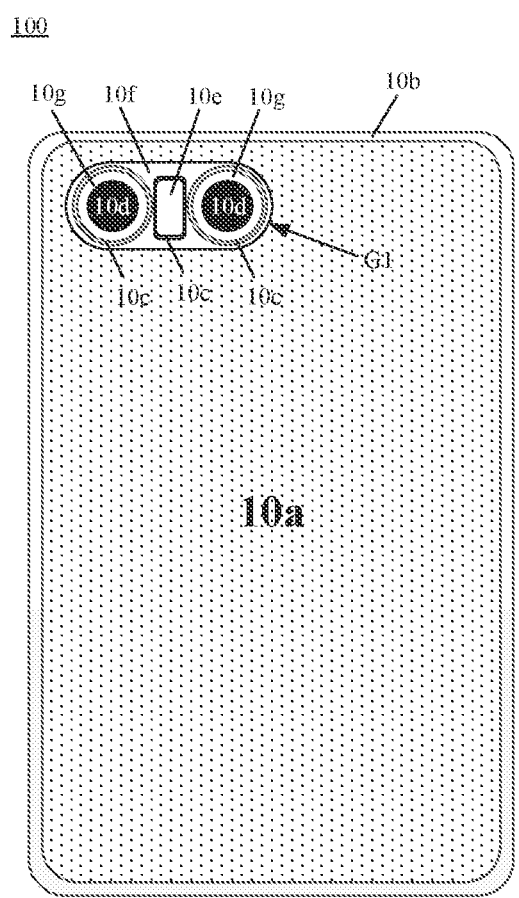
FIG. 1 is a top view of a display substrate, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained based on the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the terms such as "coupled" and "connected" and their derivatives may be used. For example, the term "connected" may be used in the description of some embodiments to indicate that two or more components are in direct physical contact or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "applicable to" or "configured to" used herein has an open and inclusive meaning, which does not exclude devices that are applicable to or configured to perform additional tasks or steps.

In addition, the phrase "based on" used herein has an open and inclusive meaning, since a process, step, calculation or other action that is "based on" one or more of the stated conditions or values may, in practice, be based on additional conditions or values exceeding those stated.

Exemplary embodiments are described herein with reference to sectional views and/or plan views as idealized exemplary drawings. In the drawings, thicknesses of layers and sizes of regions are enlarged for clarity. Thus, variations in shapes relative to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown to have a rectangular shape generally has a feature of being curved. Therefore, the regions shown in the accompanying drawings are schematic in nature, and their shapes are not intended to show actual shapes of the regions in a device, and are not intended to limit the scope of the exemplary embodiments.

A display apparatus includes a display substrate and optical sensors. In an example in which the display apparatus is a mobile phone, the display apparatus includes a camera, a proximity optical sensor, a three dimensional (3D) sensing module, and other optical sensors. These optical components need to receive light from a display surface side of the display apparatus to achieve corresponding functions. In display apparatuses, holes are generally need to be formed in the display substrate, so as to embed the optical sensors in the display substrate.

The display substrate has a display area and a bezel area disposed on at least one side of the display area. In some embodiments, the holes formed in the display substrate through a hole-forming technology include two types of holes, i.e., through holes and blind holes. The through hole and the blind hole are both formed in the display area. The advantage of the through hole is that there are no film layers to cover the optical sensor at the position of the through hole. Therefore, the through hole has a high light transmittance, and is suitable for placing devices requiring high transmittance, such as a camera. At the position of the blind hole, transparent films are reserved over an actual opening of the blind hole. Therefore, a light transmittance of the blind hole is lower than that of the through hole (where there are no film layers), but higher than that of the display area of the display substrate. The blind hole is generally used for placing components requiring a slightly low transmittance, such as a light sensor.

In a process of manufacturing the display substrate, stacked film layers need to be cut to form the through hole. Therefore, in the design of the through hole, an encapsulation structure needs to be added around the through hole to ensure the reliability of the product. The encapsulation structure has a relatively large size and occupies some space, which will reduce the area of the display area and is not conducive to increasing a screen-to-body ratio. Therefore, the number of the through holes formed in the display area is limited. However, in the design of the blind hole, there is no need to provide an encapsulation structure around the blind hole, so it does not occupy too much area of the display area. At present, the related products are provided with only through holes or only blind holes. As for display products provided with only through holes, the position of the through holes is only used for placing optical sensors requiring the high transmittance, such as cameras, and other optical sensors need to be placed in the bezel area of the display substrate and occupy a space in the bezel area, which is not conducive to narrowing the bezel of the display substrate. As for display products provided with only blind holes, if the optical sensors requiring the high transmittance are placed in the blind holes, the working effect of the optical sensors will be affected due to the loss of the transmittance. For example, an image quality of the camera will be slightly poorer.

Based on this, some embodiments of the present disclosure provide a display substrate and a display apparatus. The display substrate is provided with both through hole(s) and blind hole(s). By combining the through hole(s) and the blind hole(s), it may be possible to combine the advantage of the through hole with the high transmittance and the advantage of the blind hole without the need for providing an encapsulation structure. Therefore, it may be possible to increase the screen-to-body ratio of the display substrate and narrow the bezel without sacrificing the working effect of the optical sensor.

As shown in FIG. 1, some embodiments of the present disclosure provide a display substrate 100. The display substrate 100 may be, for example, an organic light-emitting diode (OLED) display substrate, a micro organic light-emitting diode (Micro OLED) display substrate, a quantum dot light-emitting diode (QLED) display substrate, a mini light-emitting diode (Mini LED) display substrate, a micro light-emitting diode (Micro LED) display substrate, etc.

The display substrate 100 includes an display area 10a, a bezel area 10b, at least two wiring areas 10c, at least one through hole area 10d, and at least one blind hole area 10e. Each through hole area 10d and each blind hole area 10e are both surrounded by a respective wiring area 10c of the at least two wiring areas 10c. The display area 10a surrounds the at least two wiring areas 10c. That is, the number of the at least two wiring areas 10c is equal to a sum of the number of the at least one through hole area 10d and the number of the at least one blind hole area 10e.

The description that each through hole area 10d and each blind hole area 10e are both surrounded by a respective wiring area 10c of the at least two wiring areas 10c means that, each through hole area 10d is surrounded by a corresponding wiring area 10c, and each blind hole area 10e is surrounded by a corresponding wiring area 10c. The description that the display area 10a surrounds the at least two wiring areas 10c means that, the display area 10a is located outside the at least one wiring areas 10c.

In some embodiments, as shown in FIGS. 1 and 3 to 5, the display substrate 100 further includes a hole border area 10f located between the display area 10a and the at least two wiring areas 10c. It may be understood as that, there is an enclosed area G1 in the display area 10a For example, the enclosed area G1 is in a shape of a capsule. The enclosed area G1 includes the at least two wiring areas 10c, the at least one through hole area 10d, the at least one blind hole area 10e and the hole border area 10f. The display area 10a surrounds the hole border area 10f. The hole border area 10f surrounds the at least two wiring areas 10c, and the hole border area 10f is in contact with the display area 10a and the at least two wiring areas 10c. Each through hole area 10d and each blind hole area 10e are both surrounded by a respective wiring area 10c of the at least two wiring areas 10c. The bezel area 10b surrounds the display area 10a.

The display substrate 100 includes a plurality of sub-pixels and a plurality of signal lines. In each through hole area 10d, a through hole is provided, and in each blind hole area 10e, a blind hole is provided. The at least two wiring areas 10c are used for placing the signal lines, and only the signal lines, without any sub-pixels and any structures in the sub-pixels. The plurality of signal lines are densely arranged in the at least two wiring areas 10c. The display area 10a is used for placing the plurality of sub-pixels, and each sub-pixel includes a pixel structure, so that the display area 10a may achieve display. The hole border area 10f is used for placing a plurality of redundant pixel structures, and the hole border area 10f cannot achieve display. Of course, the plurality of signal lines included in the display substrate 100 are also disposed in the display area 10a and the hole border area 10f.

The numbers, positions, sizes, and shapes of the at least one through hole area 10d and the at least one blind hole area 10e may be set according to actual needs, for example, according to the numbers of both optical sensors requiring a relatively high transmittance and optical sensors requiring a relatively low transmittance among the optical sensors included in the display apparatus.

Figure 3:
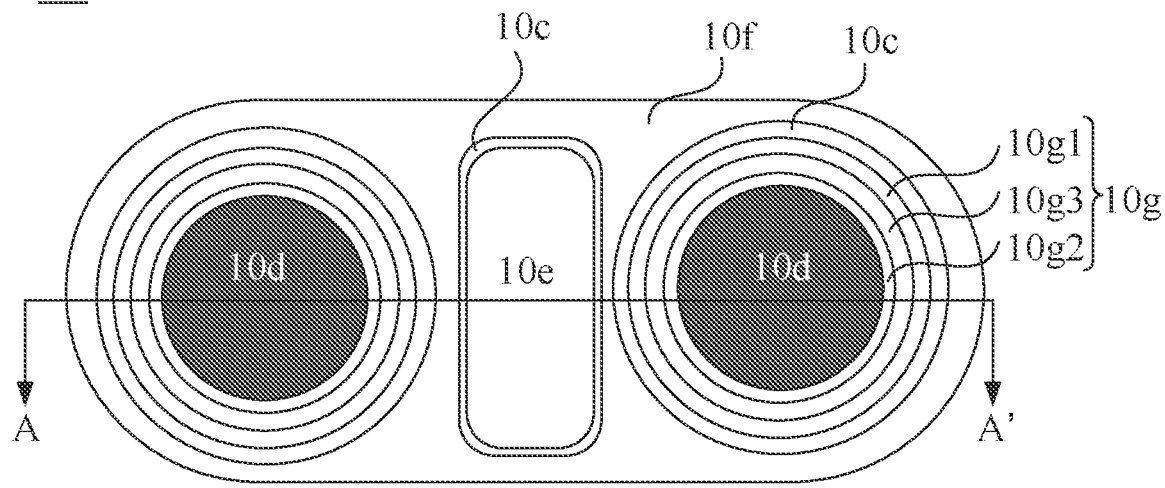
FIG. 3 is an enlarged view of the area G1 in FIG. 1.
Figure 4:
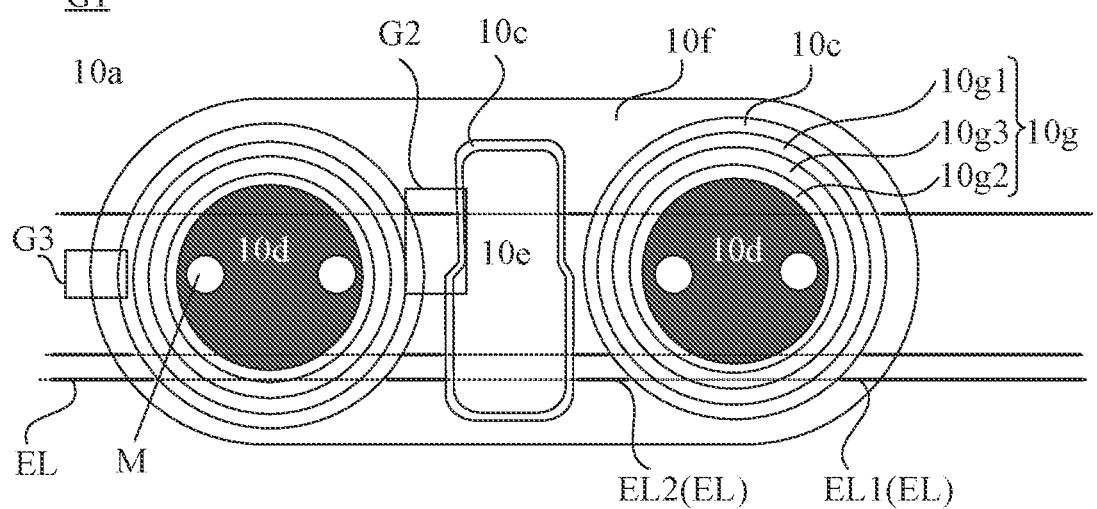
FIG. 4 is another enlarged view of the area G1 in FIG. 1.

For example, as shown in FIGS. 1, 3, and 4, the display substrate 100 includes two through hole areas 10*d* and one blind hole area 10*e*, and the blind hole area 10*e* is disposed between the two through hole areas 10*d*. Thus, the display substrate 100 includes three wiring areas 10*c*, of which two wiring areas 10*c* respectively surround the two through hole areas 10*d*, and the other wiring area 10*c* surrounds the blind hole area 10*e*. In some other examples, the blind hole area is not disposed between through hole areas, but disposed at a side of two adjacent through hole areas.

As for the designs in FIGS. 3 and 4, the two cameras may be placed in the two through holes in the two through hole areas 10*d*, and other optical sensors may be disposed in the blind hole in the blind hole area 10*e*.

Figure 5:
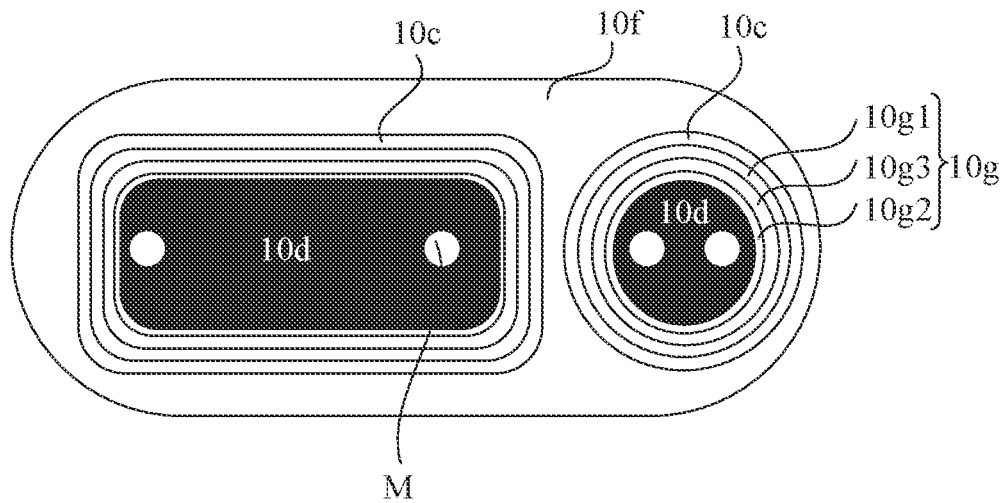
FIG. 5 is yet another enlarged view of the area G1 in FIG. 1.

In some embodiments, the blind hole and the through hole each may be in the shape of a circle, a rectangle, or other regular or irregular shapes. For example, the through hole area 10*d* is in the shape of a circle, a quasi-ellipse, or a shape formed by splicing a rectangle and two semicircles together; and the blind hole area 10*e* is in the shape of a rectangle, a rectangle with rounded corners, a shape formed by splicing rectangles with different widths together along a length direction thereof, or a shape formed by splicing rectangles with rounded corners with different widths together along a length direction thereof. As shown in FIG. 3, the through hole areas 10*d* are in the shape of a circle, and the through holes in the through hole areas 10*d* are in the shape of a circle. The blind hole area 10*e* is in the shape of a rectangle with rounded corners, and the blind hole in the blind hole area 10*e* is also in the shape of a rectangle with rounded corners. As shown in FIG. 4, the through hole areas 10*d* are in the shape of a circle, and the through holes in the through hole areas 10*d* are in the shape of a circle. The blind hole area 10*e* is in the shape of a shape formed by splicing two rectangles with rounded corners with different widths together along the length direction thereof. The shape formed by splicing the two rectangles with rounded corners with different sizes together is a shape similar to a feeding bottle. As shown in FIG. 5, the two through hole areas 10*d* are a large through hole area 10*d* and a small through hole area 10*d* that are adjacent to each other; the large through hole area 10*d* is in the shape of a rectangle with rounded corners, and the small through hole area 10*d* is in the shape of a circle.

The sizes of the through hole and the blind hole may be set according to actual needs. For example, as shown in FIGS. 3 and 4, in a case where the through holes or the blind hole is in the shape of a circle, a diameter of the circle may be in a range of 2 mm to 4 mm, inclusive. As shown in FIG. 3, a diameter of the circular through holes may be in a range of 2 mm to 4 mm, inclusive, and dimensions of the irregularly shaped blind hole in a length direction and a width direction thereof need to be set to match with the size of the circular through hole, according to actual needs. As shown in FIG. 5, a length of the large through hole area 10*d* may be in a range of 9 mm to 10 mm, inclusive, and a width thereof may be 4 mm; a diameter of the small through hole area 10*d* may be 4 mm. A left part of the large through hole area 10*d* may be provided with a camera, and a right part thereof may be provided with an optical sensor.

In some embodiments, as shown in FIGS. 3 and 4, the display substrate 100 further has at least one encapsulation area 10*g*. Each encapsulation area 10*g* is disposed between a through hole area 10*d* and a wiring area 100 surrounding the through hole area 10*d*, and surrounds the through hole area 10*d*. That is, the number of the encapsulation area(s) 10*g* is equal to the number of the through hole area(s) 10*d*, In a case where the through hole area 10*d* is in the shape of a circle, a corresponding encapsulation area 10*g* is in the shape of an annulus. In each encapsulation area 10*g*, an encapsulation structure is provided, and the encapsulation structure is disposed around the through hole area 10*d*.

In some examples, each encapsulation area 10*g* includes an encapsulation dam area 10*g*3. That is, the display substrate 100 has at least one encapsulation dam area 10*g*3. Each encapsulation dam area 10*g*3 is disposed between the through hole area 10*d* and the wiring area 10*c* surrounding the through hole area 10*d*, and surrounds the through hole area 10*d*. In each encapsulation dam area 10*g*3, at least one encapsulation dam is provided, and each encapsulation dam is disposed to surround the through hole area 10*d*.

In some examples, each encapsulation area 10*g* further includes a first isolation area 10*g*1 and a second isolation area 10*g*2. That is, the display substrate 100 further has at least one first isolation area 10*g*1 and at least one second isolation area 10*g*2. Each first isolation area 10*g*1 is disposed between the wiring area 10*c* and the encapsulation dam area 10*g*3, and surrounds the encapsulation dam area 10*g*3; each second isolation area 10*g*2 is disposed between the through hole area 10*d* and the encapsulation dam area 10*g*3, and surrounds the through hole area 10*d*. In each first isolation area 10*g*1, at least one first isolation pillar is provided, and in each second isolation area 10*g*2, at least one second isolation pillar is provided.

The at least one encapsulation dam in the at least one encapsulation dam area 10*g*3, at least one first isolation pillar in the at least one first isolation area 10*g*1 and at least one second isolation pillar in the at least one second isolation area 10*g*2 constitute the encapsulation structure.

As shown in FIGS. 3 and 4, in a direction pointing outward from a center of a through hole area 10*d*, a second isolation area 10*g*2, an encapsulation dam area 10*g*3, a first isolation area 10*g*1, and a wiring area 100 are arranged to surround the through hole area 10*d* in sequence.

A distance between the through hole area 10*d* and the blind hole area 10*e* as shown in FIGS. 3 and 4, and a distance between two adjacent through hole areas 10*d* as shown in FIG. 5 (blind hole area not shown) need to be set to ensure that space(s) are reserved for the encapsulation area(s) 10*g*, so that the encapsulation structure(s) may be provided.

Figure 6:
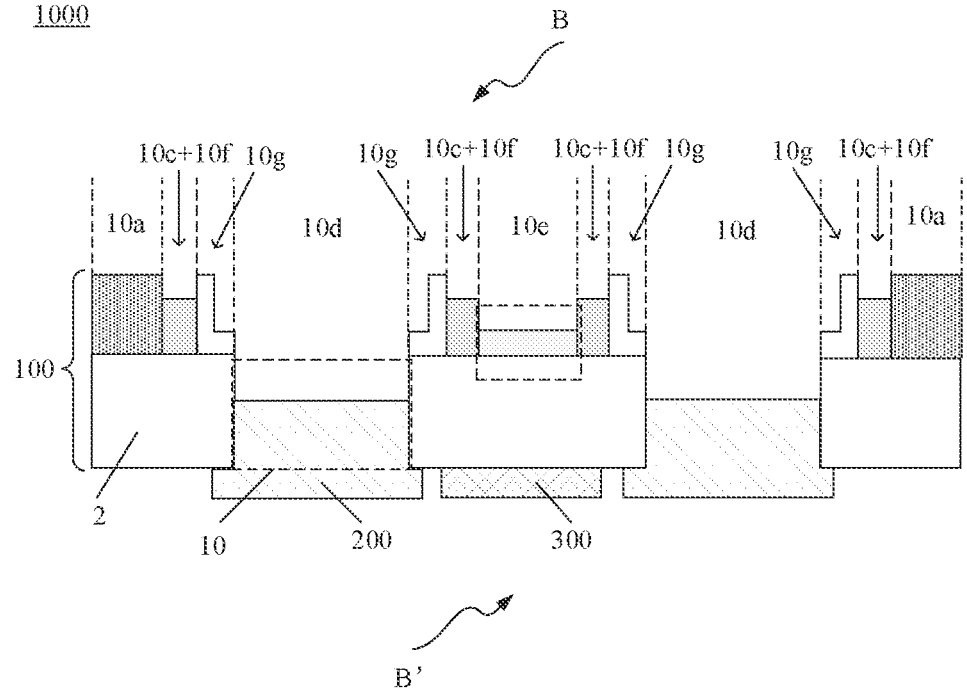
FIG. 6 is a sectional view taken along the line A-A' in FIG. 3.

In summary, as shown in FIG. 6, in the display substrate 100 provided by some embodiments of the present disclosure, at least one through hole area 10*d* and at least one blind hole area 10*e* are provided. The through hole is provided in the through hole area 10*d*, and the blind hole is provided in the blind hole area 10*e*, so that both the through hole and the blind hole may be provided in the display substrate 100. In this way, by combining the through hole and the blind hole, it may be possible to place optical sensors 200 requiring high transmittance, such as a camera, into the through hole, and place optical sensors 300 requiring low transmittance, such as an infrared sensor, a proximity optical sensor, a flood illuminator, or an ambient light sensors, into the blind hole, so as to meet the optical requirements of different optical sensors. For example, it may be possible to improve the image quality of the camera. Since there is no need to provide the encapsulation structure around the blind hole, there is no need to provide an encapsulation area corresponding to the blind hole area. Therefore, there is no need to set a large-area enclosed area, which ensure the area of the display area 10*a* and the integrity of an image displayed. In addition, since the optical sensors do not need to be arranged in the bezel area, the size of the bezel area may be reduced, which may help narrow the bezel of the display substrate and improve the screen-to-body ratio of the display substrate.

As shown in FIG. 6, the optical sensors 200 requiring high light transmittance such as cameras may be disposed directly opposite to the through holes and on a side of a base substrate of the display substrate away from a driving circuit layer, and may extend into the through holes. The optical sensor 300 requiring low light transmittance, such as an infrared sensor, a proximityoptical sensor, a flood illuminator, or an ambient light sensor, may be disposed directly opposite to the blind hole and on a side of the display substrate. The optical sensor 200 requiring high light transmittance and the optical sensors 300 requiring low light transmittance are disposed on a same side of the display substrate 100.

In the following embodiments of the present disclosure, the specific structure of the display substrate 100 will be described by taking the arrangements of through hole areas 10d and the blind hole area 10e shown in FIGS. 3 and 4 as examples.

As shown in FIG. 1, the display substrate 100 has the display area 10a, and the display area 10a has the enclosed area G1. The display substrate 100 further has two through hole areas 10d, one blind hole area 10e, two second isolation areas 10g2, two encapsulation dam areas 10g3, two first isolation areas 10g1, three wiring areas 10c, and one hole border area 10f. The blind hole area 10e is disposed between the two through hole areas 10d. Each through hole area 10d is in the shape of a circle. A wiring area 10c, a second isolation area 10g2, an encapsulation dam area 10g3, and a first isolation area 10g1 are disposed to surround a through hole area 10d in sequence. The wiring area 10c, the second isolation area 10g2, the encapsulation dam area 10g3, and the first isolation area 10g1 are all in the shape of an annulus. A wiring area 100 in the middle surrounds the blind hole area 10e. A remaining area of the enclosed area G1 except for the two through hole areas 10d, the blind hole area 10e, the two second isolation areas 10g2, the two encapsulation dam areas 10g3, the two first isolation areas 10g1, and the three wiring areas 10c is the hole border area 10f.

An overall circuit architecture of the display substrate will be introduced first below.

Figure 2:
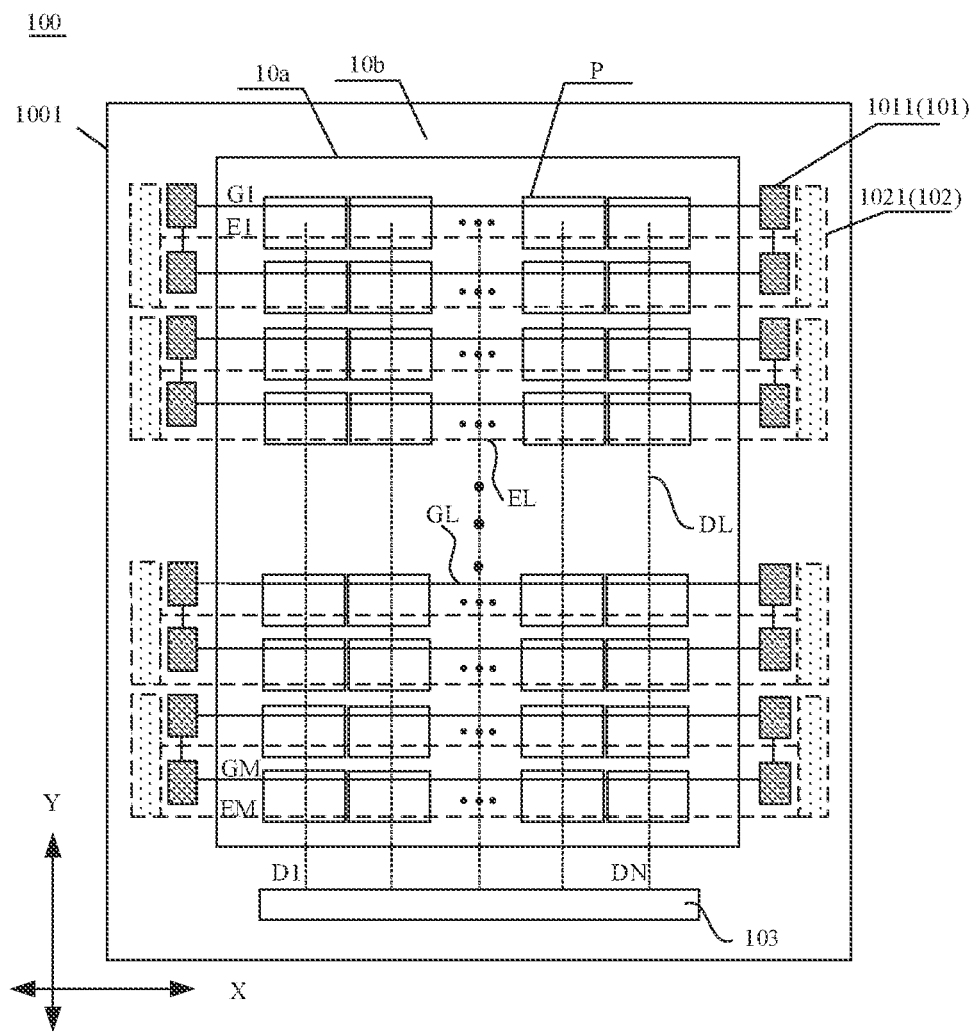
FIG. 2 is a schematic diagram of an entire circuit architecture of a display substrate, in accordance with some embodiments of the present disclosure.

As shown in FIG. 2, 1001 represents an overall outline of the display substrate 100; and the display substrate has the display area 10a (i.e., a pixel array area) and the bezel area 10b located at a periphery of the display area 10a. The display substrate 100 includes a plurality of sub-pixels P, a plurality of data lines DL, a plurality of light-emitting control signal lines EL, and a plurality of gate drive signal lines GL that are located in the display area 10a. For example, the plurality of sub-pixels P are arranged in an array. For example; the plurality of sub-pixels P are arranged in M rows and N columns. The plurality of light-emitting control signal lines EL and the plurality of gate drive signal lines GL all extend along a first direction X. For example, the plurality of light-emitting control signal lines EL are E1 to EM (M is an integer greater than 1), and the plurality of gate drive signal lines GL are G1~GM (M is an integer greater than 1). The plurality of data lines DL extend along a second direction Y. For example, the plurality of data lines DL are D1~DN (N is an integer greater than 1). Each light-emitting control signal line EL is electrically connected to a row of sub-pixels P, each gate drive signal line GL is electrically connected to the row of sub-pixels P, and each data line DL is electrically connected to a column of sub-pixels P. The first direction X intersects the second direction Y. For example, an angle between the first direction X and the second direction Y is 90°.

The display substrate 100 further includes a gate driver circuit 101 and a light-emitting control circuit 102 located in the bezel area 10b. The date driver circuit 101 includes a plurality of shift registers 1011 that are cascaded. For example, the plurality of shift registers 1011 are arranged on both sides of the display area 10a. Shift registers 1011 in a same stage are electrically connected to a single gate drive signal line GL. The gate driver circuit 101 is configured to provide the plurality of sub-pixels P with, for example, gate scan signals that shift row by row. The light-emitting control circuit 102 includes a plurality of light-emitting control units 1021 that are cascaded. For example, the plurality of light-emitting control units 1021 are arranged on the both sides of the display area 10a, and light-emitting control units 1021 in a same stage are electrically connected to a single light-emitting control signal line EL. The light-emitting control circuit 102 is configured to provide the plurality of sub-pixels P with, for example, light-emitting control signals that shift row by row.

The plurality of data lines DL are electrically connected to a source driver 103, and the source driver 103 is configured to provide data signals to the plurality of sub-pixels P through the plurality of data lines DL.

Figure 13:
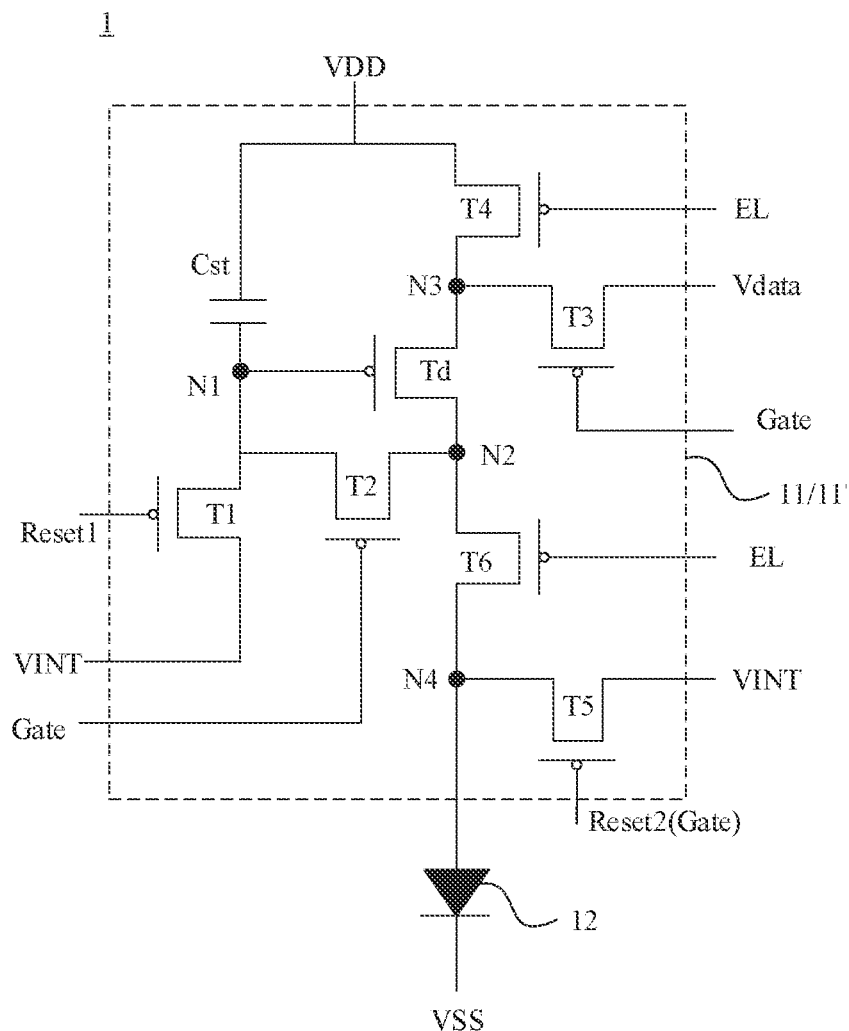
FIG. 13 is an equivalent circuit diagram of a pixel driving circuit in a display substrate, in accordance with some embodiments of the present disclosure.

As shown in FIG. 13, each sub-pixel P includes a pixel structure 1, and each pixel structure 1 includes a pixel circuit 11 and a light-emitting device 12. For example, the pixel circuit 11 may have a circuit structure of 7T1C (seven transistors and one capacitor), 8T2C (eight transistors and two capacitors), or 4T1C (four transistors and one capacitor) in the art, and the light-emitting device 12 may be, for example, an OLED or a QLED. The pixel circuit 11 operates under control of the data signal transmitted through the data line DL, the gate scan signal transmitted through the gate drive signal line GL, and the light-emitting control signal transmitted through the light-emitting control signal line EL, so as to drive the light-emitting device to emit light and thus achieve operations such as displaying content.

It will be noted that, for convenience of description, the entire circuit architecture of the display substrate shown in FIG. 2 and the above description are made by taking an example where there are no enclosed area G1 in the display area 10a. In the case where there is an enclosed area G1 in the display area 10a, the plurality of data lines DL, the plurality of light-emitting control signal lines EL, and the plurality of gate drive signal lines GL need to be arranged to avoid the through hole areas 10d and the blind hole area 10e. The enclosed area G1 is not provided with sub-pixels P capable of emitting light.

Film structures included in the display substrate 100 will be introduced below.

Figure 7:
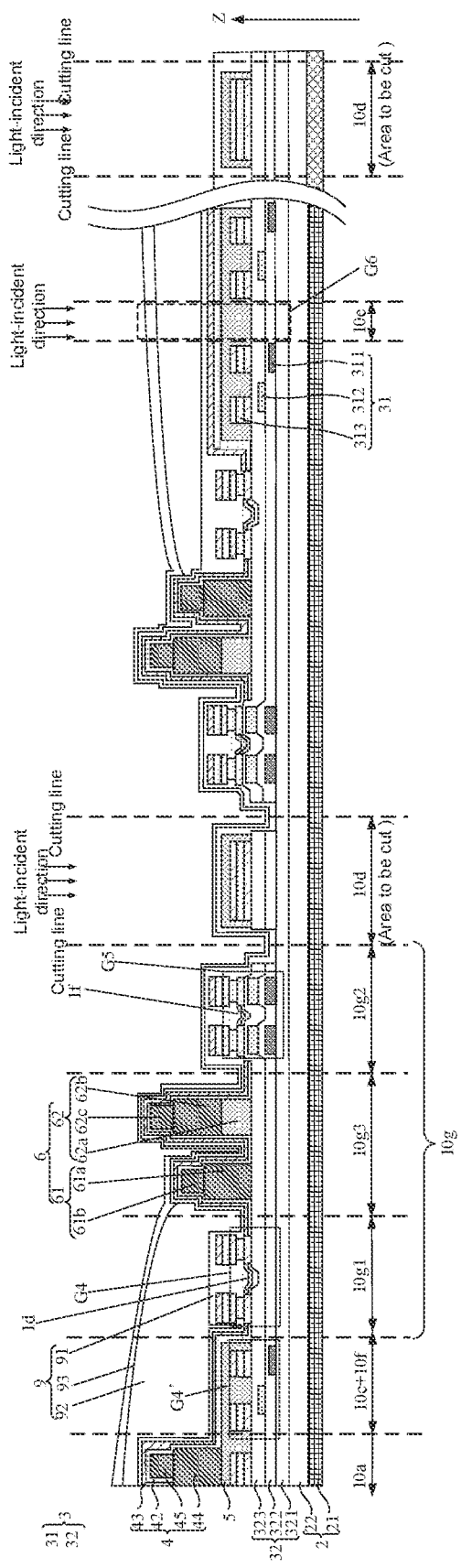
FIG. 7 is a sectional view of a display substrate before a through hole area and a blind hole area are cut, in accordance with some embodiments of the present disclosure.

As shown in FIG. 7, the display substrate 100 includes a base substrate 2 and a driving circuit layer 3 disposed on the base substrate 2.

It will be noted that the through hole and the blind hole in the display substrate 100 are generally formed by forming all the film structures included in the display substrate 100 first, and then removing films in corresponding areas. For example, all stacked layers in the through hole area 10d are cut to remove all film layers in the through hole area 10d; or, some stacked layers in the blind hole area 10e are cut to remove some film layers in the blind hole area 10e. A sectional diagram of the display substrate 100 shown in FIG. 7 is a structural diagram of the display substrate 100 before the cutting step, and portions that need to be cut and removed are marked in the figure.

The base substrate 2 has a through hole 10 in the through hole area 10*d*. For example, in a case where the display substrate 100 includes two through hole areas 10*d*, the base substrate 2 has two through holes. For example, the base substrate 2 includes a base 21 and a buffer layer 22 that are stacked. In addition, the base substrate 2 may be other kinds of composite base substrates. For example, the base substrate 2 is a flexible substrate.

The driving circuit layer 3 includes at least one metal layer 31 and at least one insulating layer 32.

The at least one insulating layer 32 is located in the display area 10*a*, the wiring areas 10*c* and the blind hole area(s) 10*e*. The at least one insulating layer 32 is made of a light-transmitting material, so as to ensure the light transmittance of the blind hole area(s) 10*e*.

In some embodiments, the at least one insulating layer 32 is further located in the hole border area 10*f* and the encapsulation area(s) 10*g*.

Figure 8A:
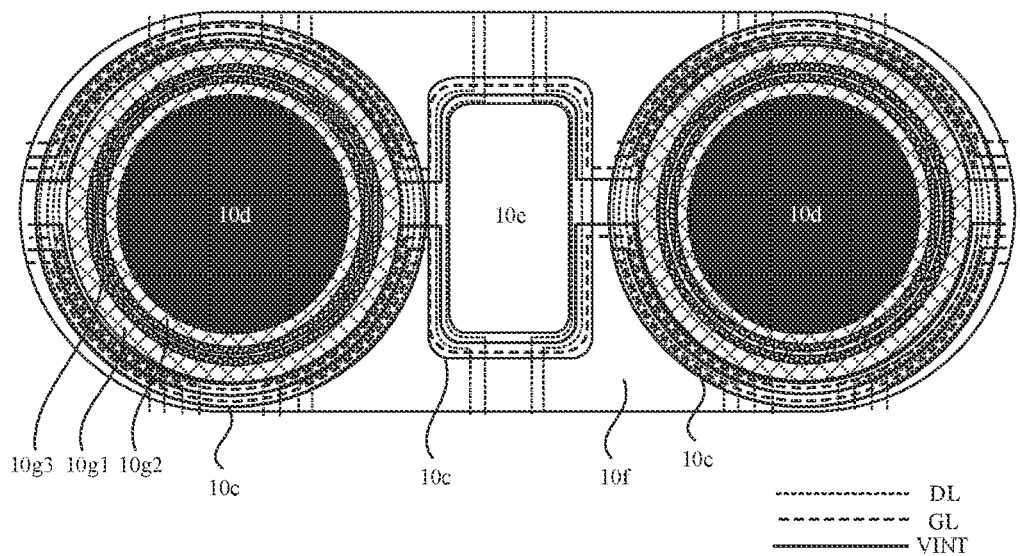
FIG. 8A is a wiring diagram of an area G1 of a display substrate; in accordance with some embodiments of the present disclosure.
Figure 8B:
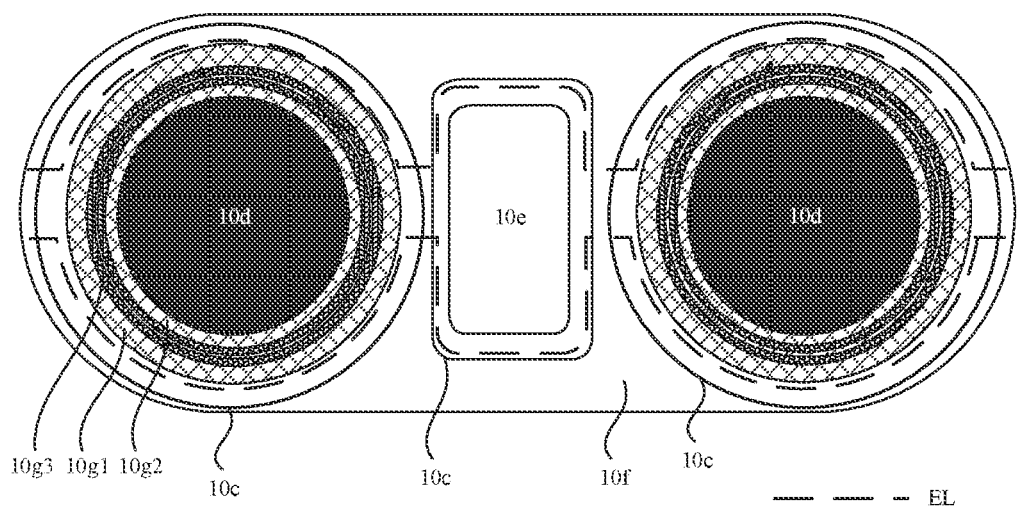
FIG. 8B is another wiring diagram of an area G1 of a display substrate; in accordance with some embodiments of the present disclosure.
Figure 8C:
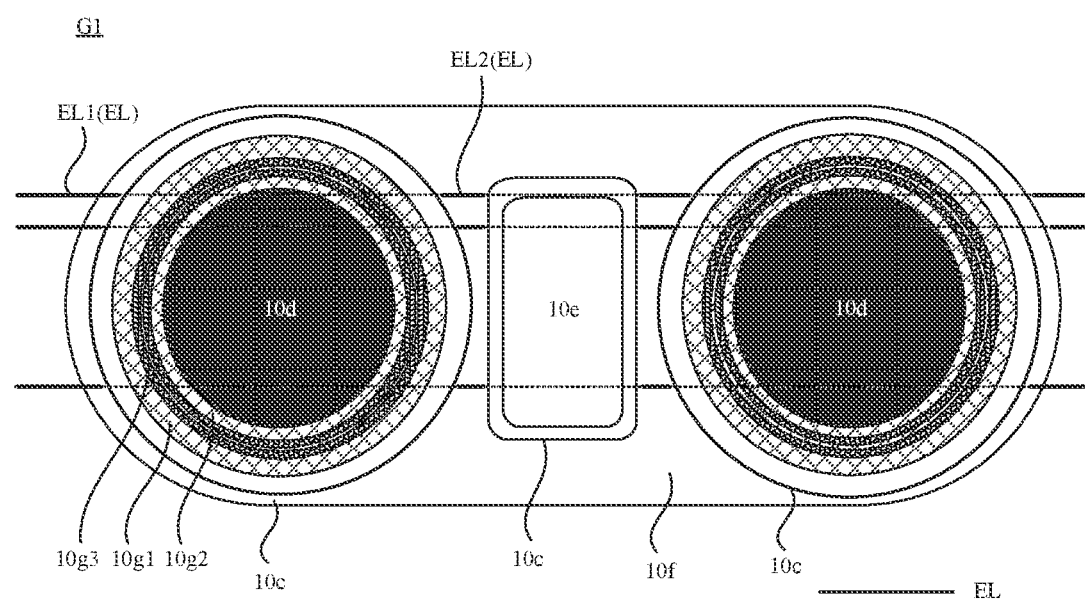
FIG. 8C is yet another wiring diagram of an area G1 of a display substrate; in accordance with some embodiments of the present disclosure.
Figure 9:
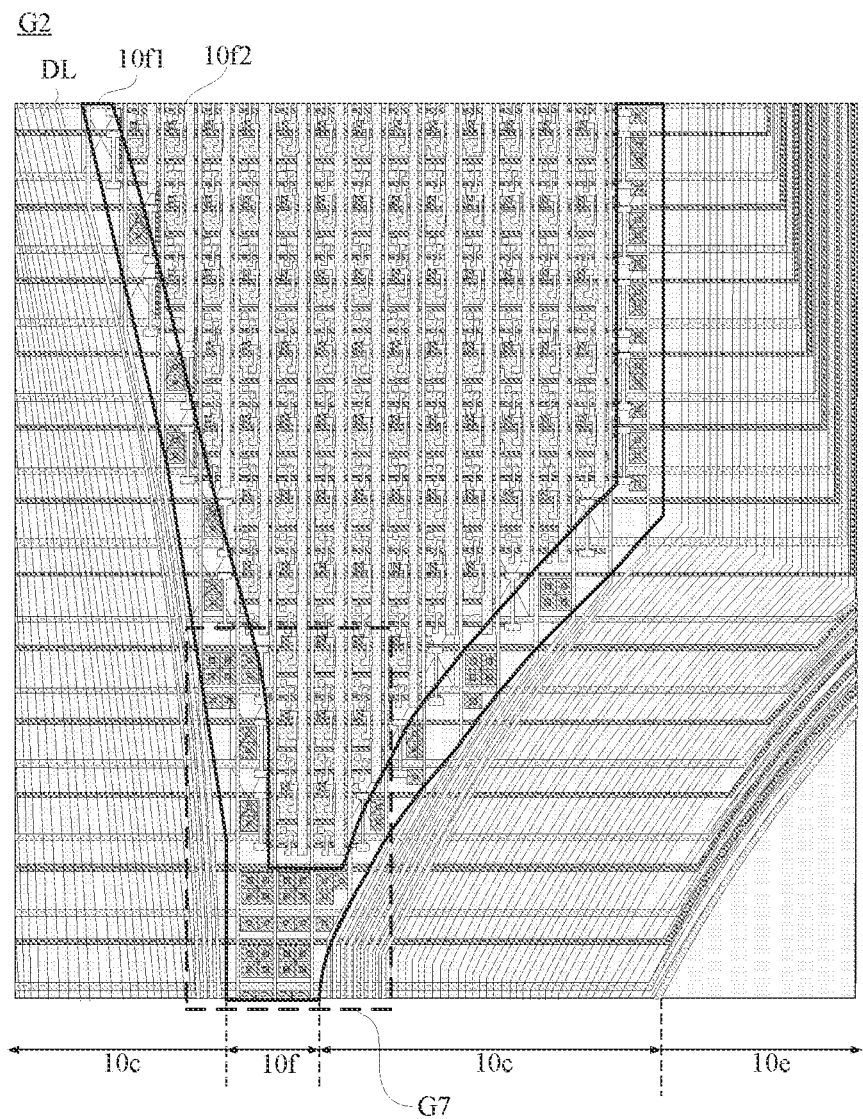
FIG. 9 is an enlarged view of the area G2 in FIG. 4.

The at least one metal layer 31 is located in the display area 10*a* and the wiring areas 10*c*. In some examples, the at least one metal layer 31 is further located in the hole border area 10*f*. As shown in FIGS. 8A to 8C, the at least one metal layer 31 includes a plurality of signal lines. For example, the plurality of signal lines are the plurality of data lines DL, the plurality of light-emitting control signal lines EL, the plurality of gate drive signal lines GL and a plurality of initialization signal lines VINT.

The at least one metal layer 31 is not disposed in the blind hole area(s) 10*e*, so that it will not block light and affect the light transmittance of the blind hole area(s) 10*e*. The plurality of signal lines are disposed to avoid the through hole area(s) 10*d* and the blind hole area(s) 10*e*.

For example, the description that the plurality of signal lines are disposed to avoid the through hole area(s) 10*d* and the blind hole area(s) 10*e* means that: at least a portion of at least one of the plurality of signal lines makes a detour around the through hole area(s) 10*d* and/or the blind hole area(s) 10*e*, so as to avoid the through hole area(s) 10*d* and the blind hole area(s) 10*e*; or, at least one of the plurality of signal lines is cut off at a position of the through hole area(s) 10*d* and/or the blind hole area(s) 10*e*, so as to avoid the through hole area(s) 10*d* and the blind hole area(s) 10*e*.

In some examples, as shown in FIGS. 2, and 8A to 8C, the plurality of data lines DL extend in the second direction Y as a whole; the plurality of light-emitting control signal lines EL, the plurality of gate drive signal lines GL, and the plurality of initialization signal lines VINT extend in the first direction X as a whole. The extending direction of the plurality of signal lines in the embodiments of the present disclosure indicates an overall extending trend of the plurality of signal lines. That is, the trend of the plurality of signal lines as a whole is generally toward a certain direction, which is not affected by the fact that a portion of some signal lines in the enclosed area G1 make a detour around the through hole area(s) 10*d* and/or the blind hole area(s) 10*e*.

Hereinafter, the description is made by taking an example where the two through hole areas 10*d* and the one blind hole area 10*e* are arranged along the first direction X.

At least one data line DL includes a portion located in the wiring area 10*c* and making a detour around the through hole area 10*d* and/or a portion located in the wiring area 10*c* and making a detour around the blind hole area 10*e*, and other portions of the data line DL are located in the display area 10*a* and the hole border area 10*f*. For example, a plurality of data lines DL that should pass right through the enclosed area G1 along the second direction Y in a case where no holes are formed need to make a detour around the through hole area 10*d* and the blind hole area 10*e* to avoid through hole area 10*d* or the blind hole area 10*e*. As shown in FIGS. 8A and 9 to 11, at least one data line DL includes a portion making a detour around the through hole area 10*d*, and the portion is curved. Since the encapsulation area 10*g* is disposed around the through hole area 10*d*, the portion of the data line DL making a detour around the through hole area 10*d* actually makes a detour around the encapsulation area 10*g*. At least one data line DL includes a portion making a detour around the blind hole area 10*e*, and the portion is a combination of a curve and a line segment.

Except for the at least one data line DL that passes through the enclosed area G1, other data lines DL are disposed in the display area 10*a*, and each data line DL extends along the second direction Y and passes right through the display area 10*a*.

At least one initialization signal line VINT includes portions located in the wiring areas 10*c* and making a detour around the through hole areas 10*d* and/or a portion located in the wiring area 10*c* and making a detour around the blind hole area 10*e*, and other portions of the initialization signal line VINT are located in the display area 10*a* and the hole border area 10*f*. For example, the initialization signal line VINT that should pass right through the enclosed area G1 along the first direction X in a case where no holes are formed needs to make a detour around the through hole areas 10*d* and the blind hole area 10*e* to avoid the through hole areas 10*d* and the blind hole area 10*e*. As shown in FIGS. 8A and 9 to 11, the at least one initialization signal line VINT includes portions making a detour around the through hole areas 10*d* and a portion making a detour around the blind hole area 10*e*. Since the encapsulation area 10*g* is disposed around the through hole area 10*d*, the portion of the initialization signal line VINT making a detour around the through hole area 10*d* actually makes a detour around the encapsulation area 10*g*. The initialization signal line VINT makes a detour around the encapsulation area 10*g* that surrounds the first through hole area 10*d*, the blind hole area 10*e*, and the encapsulation area 10*g* that surrounds the second through hole area 10*d* in order.

Except for the at least one initialization signal line VINT that passes through the enclosed area G1, other initialization signal lines VINT are disposed in the display area 10*a*, and each initialization signal line VINT extends along the first direction X and passes right through the display area 10*a*.

The at least one gate drive signal line GL includes portions located in the wiring areas 10*c* and making a detour around the through hole areas 10*d* and/or a portion located in the wiring area 10*c* and making a detour around the blind hole area 10*e*, and other portions of the gate drive signal line GL are located in the display area 10*a* and the hole border area 10*f*. For example, the gate drive signal line GL that should pass right through the enclosed area G1 along the first direction X in a case where no holes are formed needs to make a detour around the through hole areas 10*d* and the blind hole area 10*e* to avoid the through hole areas 10*d* and the blind hole area 10*e*. As shown in FIG. 8A and 9 to 11, the at least one gate drive signal line GL includes portions making a detour around the through hole areas 10*d* and a portion making a detour around the blind hole area 10*e*. Since the encapsulation area 10*g* is disposed around the through hole area 10*d*, the portion of the gate drive signal line GL making a detour around the through hole area 10*d* actually makes a detour around the encapsulation area 10*g*.

The gate drive signal line GL makes a detour around the encapsulation area 10g that surrounds the first through hole area 10d, makes a detour around the blind hole area 10e, and makes a detour around the encapsulation area 10g that surrounds the second through hole area 10d in order.

Except for the at least one gate drive signal line GL that passes through the enclosed area G1, other gate drive signal lines GL are disposed in the display area 10a, and each gate drive signal line GL extends along the first direction X and passes right through the display area 10a.

As for the light-emitting control signal line EL, in some embodiments, at least one light-emitting control signal line EL includes portions located in the wiring areas 10c and making a detour around the through hole areas 10d and/or a portion located in the wiring area 10c and making a detour around the blind hole area 10e, and other portions of the light-emitting control signal line EL are located in the display area 10a and the hole border areas 10f. For example, the light-emitting control signal line EL that should pass right through the enclosed area G1 in the first direction X in a case where no holes are formed needs to make a detour around the through hole areas 10d and the blind hole area 10e. As shown in FIG. 8B, the at least one light-emitting control signal line EL includes portions making a detour around the through hole areas 10d and a portion making a detour around the blind hole area 10e. Since the encapsulation area 10g is disposed around the through hole area 10d, the portion of the light-emitting control signal line EL making a detour around the through hole area 10d actually makes a detour around the encapsulation area 10g. The light-emitting control signal line EL makes a detour around the encapsulation area 10g that surrounds the first through hole area 10d, makes a detour around the blind hole area 10e, and makes a detour around the encapsulation area 10g that surrounds the second through hole area 10d in order.

In some other embodiments, as shown in FIGS. 4, 8C, and 9 to 11, the at least one light-emitting control signal line EL includes a portion that is located in the display area 10a and the hole border area 10f, and is cut off at the position, to which the light-emitting control signal line EL extends along the first direction X, of the through hole areas 10d and the blind hole area 10e. The light-emitting control signal line EL does not include a portion located in the wiring areas 10c.

As shown in FIGS. 4 and 8C, the light-emitting control signal line EL that should pass right through the enclosed area G1 along the first direction X in a case where no holes are formed is cut off at the position, to which the light-emitting control signal line EL extends along the first direction X, of the through hole areas 10d and the blind hole area 10e. In FIGS. 4 and 8C, a fine dash line represents the light-emitting control signal line EL that should pass right through the enclosed area G1 along the first direction X, and a thick solid line represents the light-emitting control signal line EL that is cut off, It will be seen that the light-emitting control signal line EL is cut into a plurality of portions.

Figure 10:
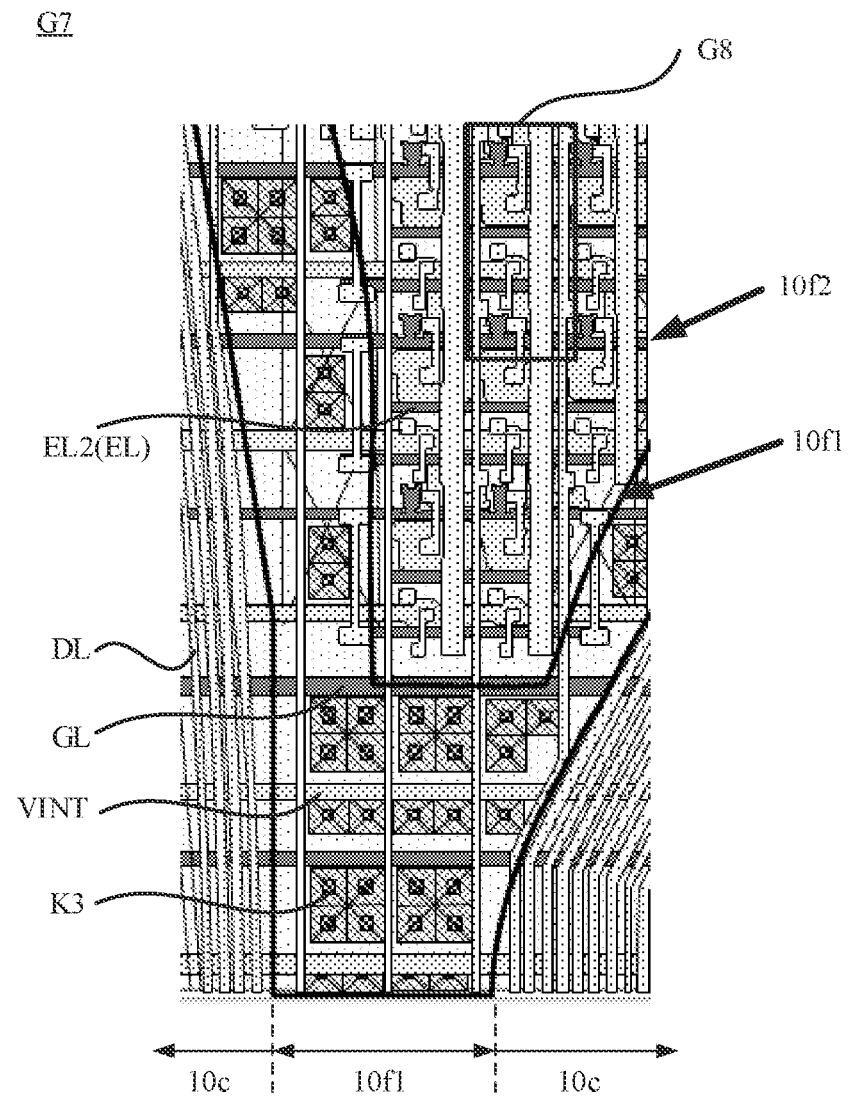
FIG. 10 is an enlarged view of the area G7 in FIG. 9.
Figure 11:
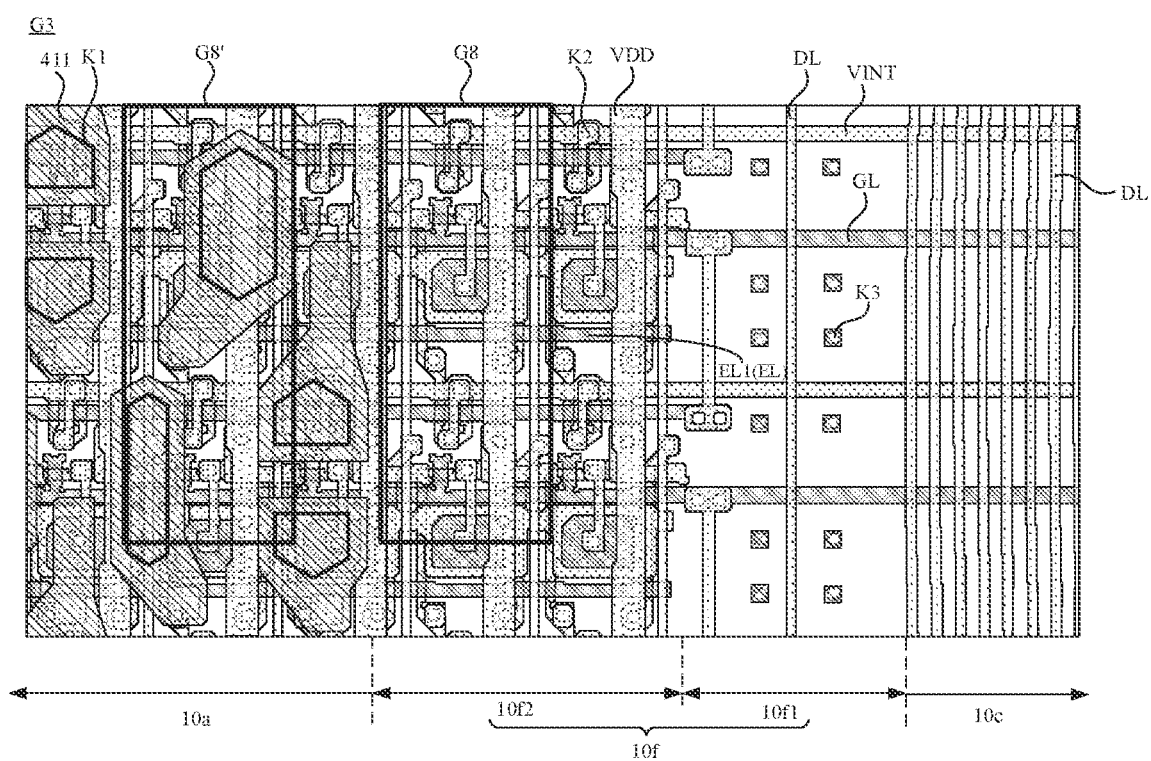
FIG. 11 is an enlarged view of the area G3 in FIG. 4.

For example, as shown in FIGS. 4 and 8C, among the at least one light-emitting control signal line EL that passes through the enclosed area G1, each light-emitting control signal line EL includes a first light-emitting control signal line EL1 and a second light-emitting control signal line EL2. As shown in FIG. 11, the first light-emitting control signal line EL1 of each light-emitting control signal line EL is located in the display area 10a and the hole border area 10f, and the first light-emitting control signal line EL1 extends from both sides of the display area 10a to the center along the first direction X, and is cut off at positions proximate to wiring areas 10c each surrounding a through hole area 10c 1 As shown in FIGS. 8C and 10, the second light-emitting control signal line EL2 of each light-emitting control signal line EL is located in portions of the hole border area 10f between the through hole area 10d and the blind hole area 10e that are adjacent. The second light-emitting control signal line EL2 is relatively short, and the second light-emitting control signal line EL2 extends along the first direction X and both ends away from the blind hole area 10e of the second light-emitting control signal line EL2 are cut off at positions proximate to the wiring areas 10c.

The first light-emitting control signal line EL1 of each light-emitting control signal line EL is electrically connected to the light-emitting control circuit 102 in the bezel area 10b to transmit a light-emitting control signal, so as to control the sub-pixels in the display area 10a to display content. The second light-emitting control signal line EL2 is not electrically connected to the light-emitting control circuit 102, therefore the second light-emitting control signal line EL2 does not transmit electrical signals. Since the hole border area 10f itself does not have a display function, such design will not affect the overall display effect of the display substrate 100.

Except for the at least one light-emitting control signal line EL that passes through the enclosed area G1, other light-emitting control signal lines EL are disposed in the display area 10a, and each light-emitting control signal line EL extends along the first direction X and passes right through the display area 10a.

It will be noted that, in order to ensure that portions, in the display area 10a, of the plurality of signal lines that pass through the enclosed area G1 display area are arranged at original intervals, portions of the plurality of signal lines located in the wiring area 10c are densely arranged.

Figure 18:
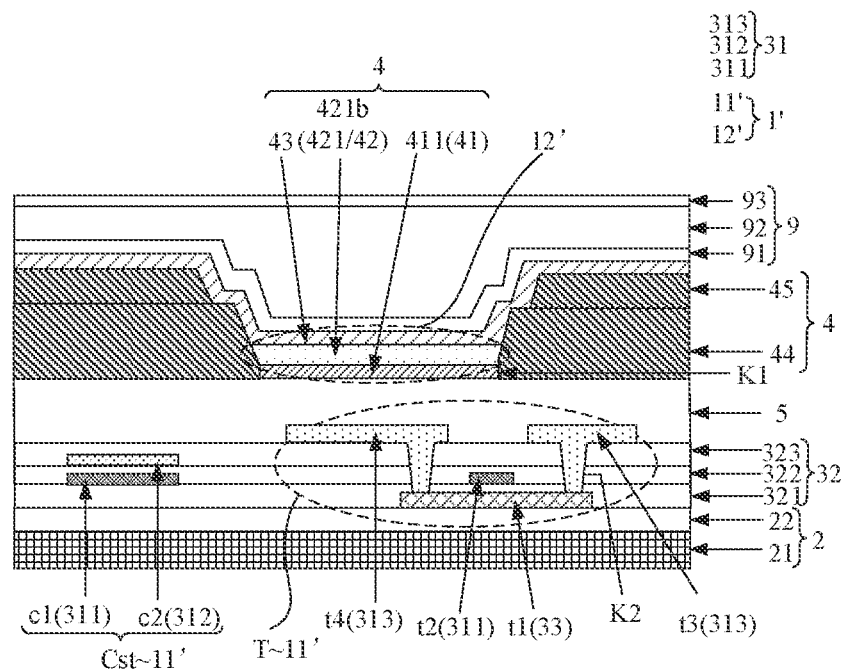
FIG. 18 is a sectional view of a hole border area of another display substrate, in accordance with some embodiments of the present disclosure.

In some embodiments, as shown in FIGS. 7 and 143 to 18, the at least one metal layer 31 includes a first gate layer 311, a second gate layer 312, and a source-drain metal layer 313; and the at least one insulating layer 32 includes a first insulating layer 321, a second insulating layer 322 and an interlayer insulating layer 323.

The driving circuit layer 3 further includes a semiconductor layer 33, and the semiconductor layer 33 is located in the hole border area 10f and the display area 10a.

Figure 14A:
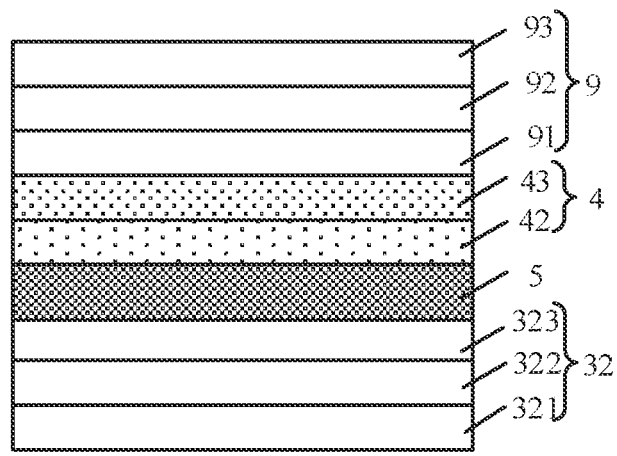
FIG. 14A is an enlarged view of the area G6 in FIG. 7.
Figure 14B:
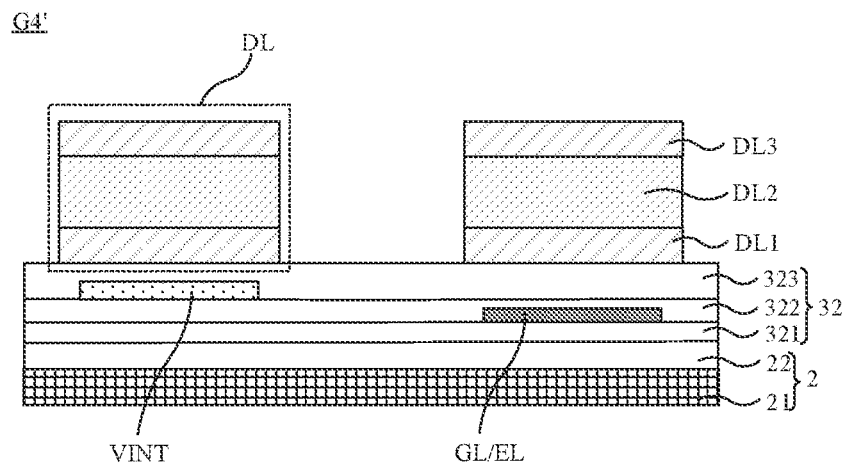
FIG. 14B is an enlarged view of the area G4' in FIG. 7.
Figure 15:
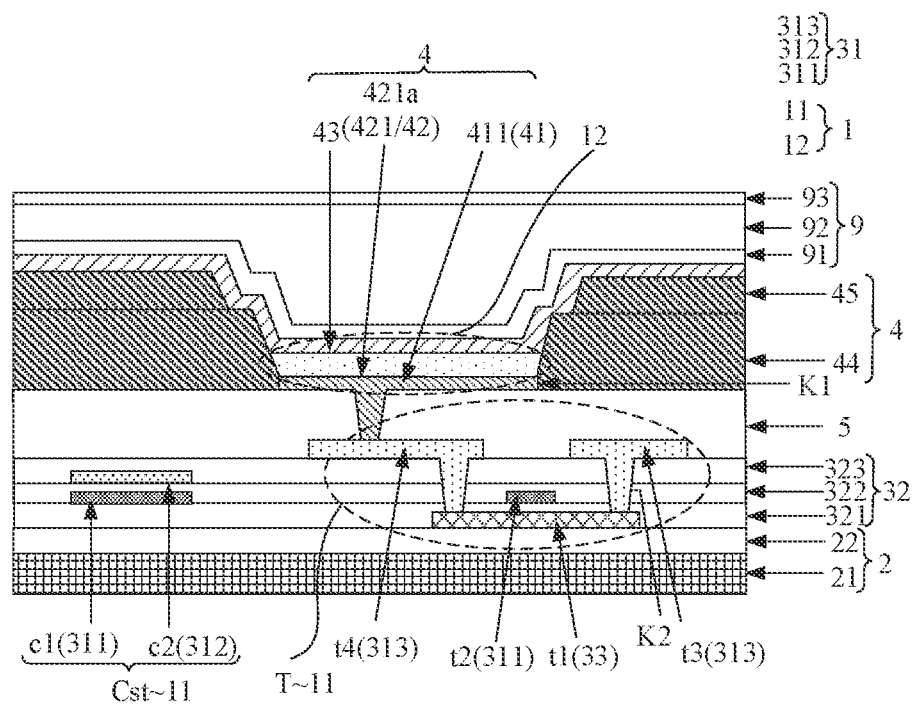
FIG. 15 is a sectional view of a display area of a display substrate, in accordance with some embodiments of the present disclosure.

As shown in FIGS. 7, 14B and 15, the semiconductor layer 33 is disposed on a side of the base substrate 2, the first insulating layer 321 is disposed on a side of the semiconductor layer 33 away from the base substrate 2, and the first gate layer 311 is disposed on a side of the first insulating layer 321 away from the base substrate 2; the second insulating layer 322 is disposed on a side of the first gate layer 311 away from the base substrate 2; the second gate layer 312 is disposed on a side of the second insulating layer 322 away from the base substrate 2; the interlayer insulating layer 323 is disposed on a side of the second gate layer 312 away from the base substrate 2; and the source-drain metal layer 313 is disposed on a side of the interlayer insulating layer 323 away from the base substrate 2.

In some embodiments, the plurality of data lines DL are located in the source-drain metal layer 313. The plurality of light-emitting control signal lines EL and the plurality of gate drive signal lines GL are located in one of the first gate layer 311 and the second gate layer 312; and the plurality of initialization signal lines VINT are located in the other of the second gate layer 312 and the first gate layer 311. For example, as shown in FIGS. 7 and 14B, the plurality of light-emitting control signal lines EL and the plurality of gate drive signal lines GL are all located in the first gate layer 311, and the plurality of initialization signal lines VINT are located in the second gate layer 312.

In some examples, as shown in FIG. 14B, each data line DL includes a first data line pattern DL1, a second data line pattern DL2, and a third data line pattern DL3 that are sequentially stacked. The first data line pattern DL1, the second data line pattern DL2 and the third data line pattern DL3 are all made of metal. For example, the first data line pattern DL1 and the third data line pattern DL3 are made of titanium, and the second data line pattern DL2 is made of aluminum. Each data line DL has a titanium-aluminum-titanium structure, which may improve the oxidation resistance of the data line DL on a basis of ensuring the conductivity thereof.

Figure 16:
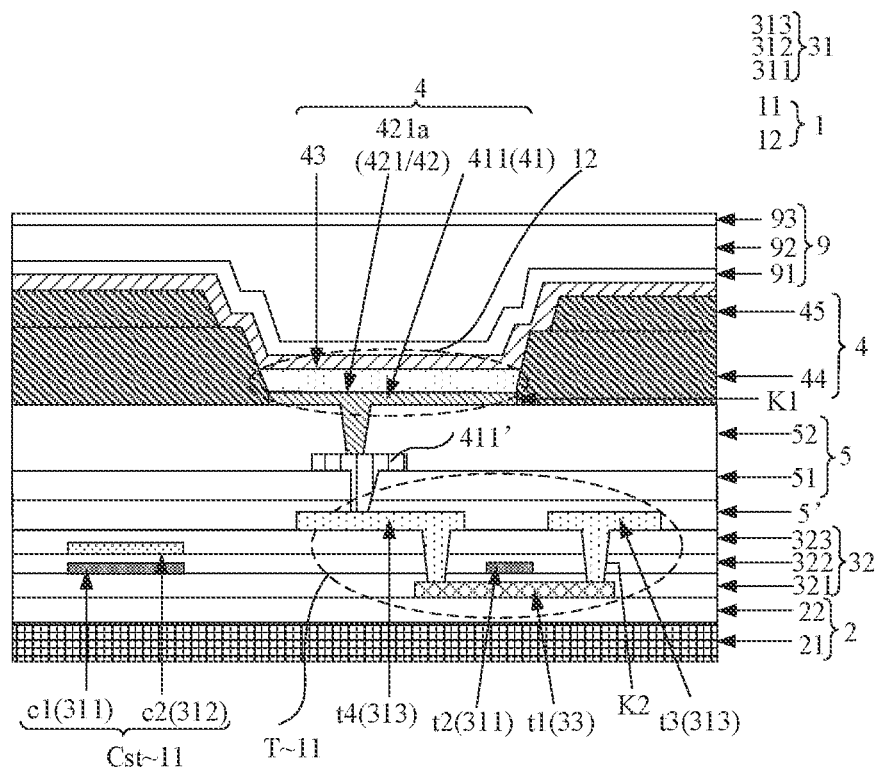
FIG. 16 is a sectional view of a display area of another display substrate, in accordance with some embodiments of the present disclosure.
Figure 17:
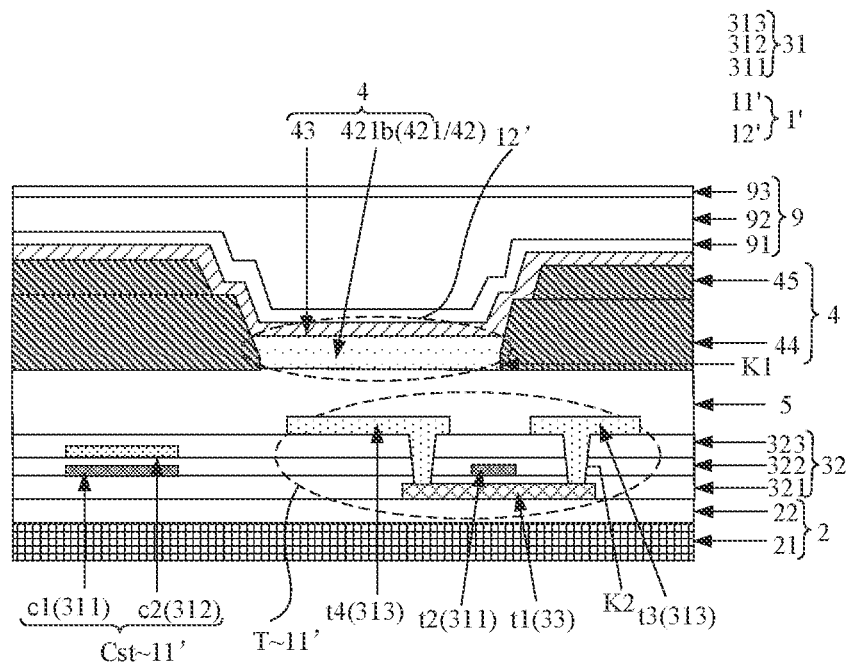
FIG. 17 is a sectional view of a hole border area of a display substrate, in accordance with some embodiments of the present disclosure.

In some embodiments, as shown in FIGS. 15 and 16, the display area 10a is provided with a plurality of pixel structures 1 therein; each pixel structure 1 includes a pixel circuit 11 and a light-emitting device 12, and the pixel circuit 11 is electrically connected to the light-emitting device 12. In some other embodiments, as shown in FIGS. 17 and 18, the hole border area 10f is provided with a plurality of redundant pixel structures 1'. The hole border area 10f cannot perform display, and the redundant pixel structures 1' cannot work normally. Each redundant pixel structure 1' includes a redundant pixel circuit 11' and a redundant light-emitting device 12'. The redundant pixel circuit 11' has a same structure as the pixel circuit 11. As shown in FIG. 13, the pixel circuit 11 and the light-emitting device 12 in the pixel structure 1 and the redundant pixel circuit 11' and the redundant light-emitting device 12' in the redundant pixel structure 1' will be introduced below.

In some examples, as shown in FIGS. 7 and 15 to 18, the display substrate 100 further includes a light-emitting device layer 4 disposed on a side of the driving circuit layer 3 away from the base substrate 2. The light-emitting device layer 4 is located in the display area 10a and the hole border area 10f.

The light-emitting device layer 4 includes a first electrode layer 41, a functional layer 42, a second electrode layer 43 and a pixel defining layer 44.

The first electrode layer 41 is disposed on the side of the driving circuit layer 3 away from the base substrate 2, and the first electrode layer 41 includes a plurality of first electrodes 411. For example, the first electrode layer 41 is an anode layer, and the first electrode 411 is an anode. The first electrode layer 41 is made of, for example, at least one of indium tin oxide (ITO), indium zinc oxide (IZO), gold (Au), platinum (Pt), and silicon (Si).

The pixel defining layer 44 is disposed on a side of the first electrode layer 41 away from the base substrate 2. The pixel defining layer 44 is provided with a plurality of openings K1 therein. Each opening K1 exposes at least a portion of a first electrode 411, and each opening K1 is located in a sub-pixel P. As shown in FIG. 11, in the display area 10a, as for the openings K of the pixel defining layer 44, a contour line of each opening K1 is located within a range of a first electrode 411.

The functional layer 42 is disposed on a side of the first electrode layer 41 away from the base substrate 2. The functional layer 42 includes a plurality of light-emitting portions 421, and each light-emitting portion 421 is located in an opening K1.

In some embodiments, the functional layer 42 further includes a hole transport layer (HTL) and an electron transport layer (ETL).

For example, the hole transport layer is disposed on the side of the first electrode layer 41 away from the base substrate 2, the plurality of light-emitting portions 421 are disposed on a side of the hole transport layer away from the base substrate 2, and the electron transport layer is disposed on a side of the plurality of light-emitting portions 421 away form the base substrate 2. The hole transport layer and the electron transport layer each include portions located in the plurality of openings K1 and portions located outside the plurality of openings K1. For example, the functional layer 42 in the sectional view of FIG. 7 illustrates the hole transport layer and the electron transport layer, and does not illustrate the plurality of light-emitting portions 421.

The second electrode layer 43 is disposed on a side of the functional layer 42 and the pixel defining layer 44 away from the base substrate 2. For example, the second electrode layer 43 is a cathode layer.

In some embodiments, the light-emitting device layer 4 further includes a capping layer (CPL) disposed on a side of the second electrode layer 43 away from the base substrate 2. The capping layer is configured to enhance the luminous efficiency of the light-emitting device.

In some embodiments, the light-emitting device layer 4 further includes a support layer 45 disposed between the pixel defining layer 44 and the second electrode layer 43, and the support layer 45 and the pixel defining layer 44 may be made of a same material.

As shown in FIG. 7, the display substrate 100 further includes a planarization layer 5 disposed between the driving circuit layer 3 and the light-emitting device layer 4. The planarization layer 5 is located in the display area 10a, the wiring areas 10c, the hole border area 10f, and the blind hole area 10e. The planarization layer 5 covers the source-drain metal layer 313.

In some embodiments, the planarization layer 5 is made of a transparent insulating material. For example, the planarization layer 5 is made of silicon oxide, silicon nitride, or silicon oxynitride.

In some embodiments, as shown in FIG. 16, the planarization layer 5 has a double-layer structure. The planarization layer 5 includes a first planarization layer 51 and a second planarization layer 52 that are stacked, and the first planarization layer 51 is closer to the base substrate 2 than the second planarization layer 52.

In this case, as shown in FIG. 16, the display substrate 100 further includes a plurality of transfer electrodes 411'; each transfer electrode 411' is electrically connected to a first electrode 411, and the transfer electrode 411' is electrically connected to a pixel circuit 11 through a via hole.

In addition, the display substrate 100 further includes a passivation layer 5' disposed between the first planarization layer 51 and the source-drain metal layer 313. The passivation layer 5' may be made of materials such as silicon oxide, silicon nitride, or silicon oxynitride; and the passivation layer 5' covers the source-drain metal layer 313. The above via hole penetrates the first planarization layer 51 and the passivation layer 5', so that the transfer electrode 411' is electrically connected to the thin film transistor in the pixel circuit 11 through the via hole.

In some embodiments, as shown in FIGS. 15 and 16, among the plurality of pixel structures 1 disposed in the display area 10a, each pixel structure 1 includes the pixel circuit 11 and the light-emitting device 12. The light-emitting device 12 includes a first electrode 411 electrically connected to the pixel circuit 11, a first light-emitting portion 421a, and a portion of the second electrode layer 43 corresponding to the first light-emitting portion 421a.

In some other embodiments, as shown in FIGS. 17 and 18, among the plurality of redundant pixel structures 1' disposed in the hole border area 10f, each redundant pixel structure 1' includes the redundant pixel circuit 11' and/or the redundant light-emitting device 12'. The hole border area 10f cannot perform display, and the redundant pixel structure 1' cannot work normally. For example, each redundant pixel structure 1' includes the redundant pixel circuit 11' and the redundant light-emitting device 12'. The redundant pixel circuit 11' has the same structure as the pixel circuit 11. As shown in FIG. 17, the redundant light-emitting device 12' includes a second light-emitting portion 421b and a portion of the second electrode layer 43 corresponding to the second light-emitting portion 421b. Or, as shown in FIG. 18, the redundant light-emitting device 12' includes a first electrode 411, a second light-emitting portion 421b and a portion of the second electrode layer 43 corresponding to the second light-emitting portion 421b; the first electrode 411 is not electrically connected to the redundant pixel circuit 11'.

Figure 12:
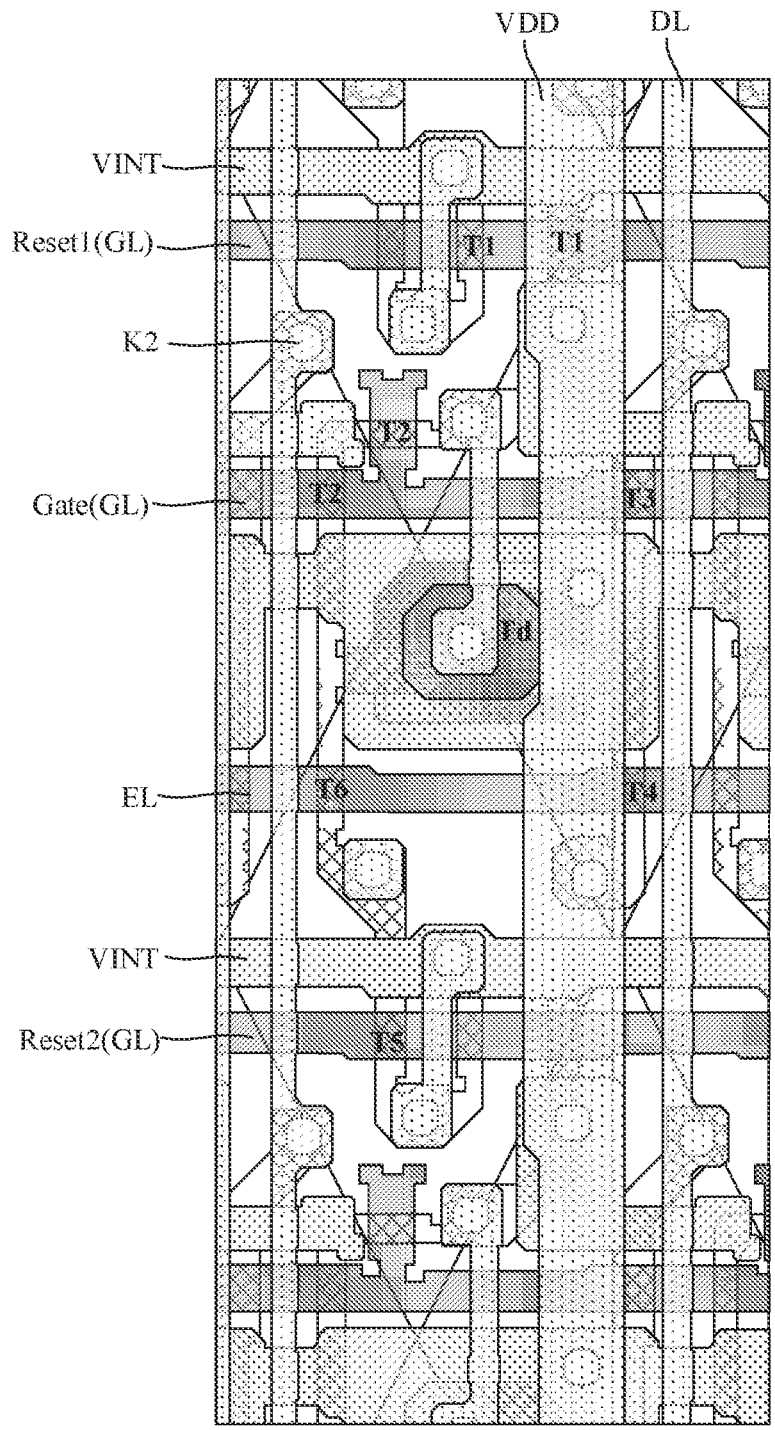
FIG. 12 is an enlarged view of the area G8 in FIGS. 10 and 11 or the area G8' in FIG. 11.

In some embodiments, the pixel circuit 11 and the redundant pixel circuit 11' both include at least one thin film transistor T, and both further include a storage capacitor. The pixel circuit 11 has a same circuit structure as the redundant pixel circuit 11'. For example, they both have a 7T1C, 8T2C, or 4T1C structure. FIG. 12 is an enlarged view of the area G8 in FIGS. 10 and 11 and the area G8' in FIG. 11. As shown in FIG. 12, as an example, the pixel circuit 11 and the redundant pixel circuit 11' both have the 7T1C structure. The structure of the redundant pixel circuit 11' will be introduced below by taking the redundant pixel circuit 11' located in the hole border area 10f as an example.

As shown in FIGS. 12 and 13, the redundant pixel circuit 11' includes a first transistor T1, a second transistor T2, a third transistor T3, a fourth transistor T4, a fifth transistor T5, a sixth transistor T6, a driving transistor Td, and a storage capacitor Cst. As for a redundant pixel circuit 11', the redundant pixel circuit 11' is electrically connected to three gate drive signal lines GL and one light-emitting control signal line EL; the three gate drive signal lines GL are a gate scan line Gate, a first reset signal line Reset1, and a second reset signal line Reset2.

It will be noted that the display substrate 100 further includes a plurality of first voltage signal lines VDD disposed in the display area 10a and the hole border area 10f. For example, the plurality of first voltage signal lines VDD are located in the source-drain metal layer 313.

A first terminal of the storage capacitor Cst is electrically connected to a first voltage signal line VDD, and a second terminal of the storage capacitor Cst is electrically connected to a first node N1.

A control electrode of the driving transistor Td is electrically connected to the first node N1, a first electrode of the driving transistor Td is electrically connected to a third node N3, and a second electrode of the driving transistor Td is electrically connected to a second node N2. A control electrode of the first transistor T1 is electrically connected to the first reset signal line Reset1, a first electrode of the first transistor T1 is electrically connected to the initialization signal line VINT, and a second electrode of the first transistor T1 is electrically connected to the first node N1.

A control electrode of the second transistor T2 is electrically connected to the gate scan line Gate, a first electrode of the second transistor T2 is electrically connected to the second electrode of the driving transistor Td, and a second electrode of the second transistor T2 is electrically connected to the first node N1.

A control electrode of the third transistor T3 is electrically connected to the gate scan line Gate, a first electrode of the third transistor T3 is electrically connected to the data line DL, and a second electrode of the third transistor T3 is electrically connected to the third node N3.

A control electrode of the fourth transistor T4 is electrically connected to the light-emitting control signal line EL, a first electrode of the fourth transistor T4 is electrically connected to the first voltage signal line VDD, and a second electrode of the fourth transistor T4 is electrically connected to the third node N3.

A control electrode of the fifth transistor T5 is electrically connected to the second reset signal line Reset2, a first electrode of the fifth transistor T5 is electrically connected to the initialization signal line VINT, and a second electrode of the fifth transistor T5 is electrically connected to a fourth node N4.

A control electrode of the sixth transistor T6 is electrically connected to the light-emitting control signal line EL, a first electrode of the sixth transistor T6 is electrically connected to the second node N2, and a second electrode of the sixth transistor T6 is electrically connected to the fourth node N4.

As shown in FIGS. 11 and 12, in the display area 10a, the pixel structure 1 includes the pixel circuit 11 and the light-emitting device 12, and the second electrode of the sixth transistor T6 in the pixel circuit 11 is electrically connected to the first electrode 411 of the light-emitting device 12, so that the six transistor T6 transmits a driving signal to the first electrode 411 to control the light-emitting device 12 to emit light. In some embodiments, as shown in FIGS. 10 and 11, in the hole border area 10f, the redundant pixel structure 1' includes the pixel circuit 11' and the light-emitting device 12', and the light-emitting device 12' does not include the first electrode. Thus, a second electrode of a sixth transistor T6 in the pixel circuit 11' is not electrically connected to other devices, and the light-emitting device 12' does not emit light, so the hole border area 10f does not perform display.

In some embodiments, each thin film transistor T includes an active layer t1, a gate t2, a source t3 and a drain t4. The active layer t1 is located in the semiconductor layer 33, the gate t2 is located in the first gate layer 311, and the source t3 and the drain t4 are located in the source-drain metal layer 313. The gate t2 of the thin film transistor T, the plurality of light-emitting control signal lines EL and the plurality of gate drive signal lines GL are disposed in a same layer. The source t3 and the drain t4 of the thin film transistor T and the plurality of data lines DL are disposed in a same layer. Thin film transistors in the sectional views of FIGS. 15 to 18 may be regarded as the sixth transistor T6 in the pixel circuit 11 or the redundant pixel circuit 11'.

As shown in FIG. 15, the storage capacitor Cst may include a first electrode plate c1 (the first terminal) and a second electrode plate c2 (the second terminal). The first electrode plate c1 is located in the first gate layer 311, and is disposed in a same layer as the gate t2 of the thin film transistor T, the plurality of light-emitting control signal lines EL and the plurality of gate drive signal lines GL. The second electrode plate c2 is located in the second gate layer 312, and is disposed in a same layer as the plurality of initialization signal lines VINT The first electrode plate c1 and the second electrode plate c2 are disposed opposite to each other.

Materials of the gate t2 of the thin film transistor T, the first electrode plate c1 and the second electrode plate c2 may include metal materials or alloy materials, such as molybdenum, aluminum, and titanium. The source t3 and the drain t4 of the thin film transistor T may be made of metal materials or alloy materials; for example, they may be of a metal single-layer or multi-layer structure formed of molybdenum, aluminum, titanium, etc. For example, the multi-layer structure is a multi-layer metal laminated layer, such as a three-layer metal laminated layer of titanium, aluminum, and titanium (Ti/Al/Ti), etc.

As shown in FIGS. 10 and 11, the hole border area 10f includes a first sub-area 10f1 proximate to the wiring area 10c, and a second sub-area 10f2 apart from the first sub-area 10f1. All thin film transistors T in the pixel circuits 11' of the plurality of redundant pixel structures 1' are disposed in the second sub-area 10f2. The first sub-area 10f1 has a relatively narrow space, thus the thin film transistors T cannot be disposed herein.

The display substrate 100 further includes a plurality of via holes K2 disposed in the second sub-area 10f2 of the hole border area 10f, and a plurality of redundant via holes K3 disposed in the first sub-area 10f1 of the hole border area 10f.

As shown in FIGS. 17 and 18, each via hole K2 penetrates the first insulating layer 321, the second insulating layer 322, and the interlayer insulating layer 323. The plurality of redundant pixel structures 1' are disposed in the second sub-area 10f2 of the hole border area 10f, and the source t3 and the drain t4 of each thin film transistor T of the plurality of redundant pixel structures 1' are electrically connected the active layer t1 thereof through the via holes K2. For example, the source t3 and the drain t4 of each thin film transistor T are electrically connected to the active layer t1 thereof through two via holes K2.

Of course, as shown in FIGS. 15 and 16, the display substrate 100 further includes a plurality of via holes K2 disposed in the display area 10a, and the source t3 and the drain t4 of each thin film transistor T of the pixel structures 1 in the display area 10a are electrically connected the active layer t1 thereof through the via holes K2. For example, the source t3 and the drain t4 of each thin film transistor T are respectively electrically connected to the active layer t1 thereof through two via holes K2.

As shown in FIG. 10, each redundant via hole K3 penetrates the first insulating layer 321, the second insulating layer 322, and the interlayer insulating layer 323. Portions of the planarization layer 5 fill the plurality of redundant via holes K3.

In some examples, the size of the plurality of redundant via holes K3 may be determined according to the size of the first sub-area 10f1, but the number thereof may not be limited. The purpose of providing the plurality of redundant via holes K3 is to balance the difference in the density between the via holes in the hole border area 10f and the display area 10a.

Structures disposed in the encapsulation area 10g of the display substrate 100 will be described below.

In some embodiments, as shown in FIG. 7, the display substrate 100 further includes at least one encapsulation dam area 10g3. Each encapsulation dam area 10g3 is located between a through hole area 10d and a wiring area 100 surrounding the through hole area 10d, and surrounds the through hole area 10d. For example, the display substrate 100 includes two encapsulation dam areas 10g3, and each encapsulation dam area 10g3 surrounds a single through hole area 10d.

The first insulating layer 321, the second insulating layer 322, and the interlayer insulating layer 323 are further located in the at least one encapsulation dam area 10g3.

The display substrate 100 further includes one or more encapsulation dams 6. Each encapsulation dam area 10g3 is provided with at least one encapsulation dam 6 therein; each encapsulation dam 6 surrounds a through hole area 10d, and the encapsulation dam 6 is disposed on the side of the driving circuit layer 3 away from the base substrate 2.

In a case where each encapsulation dam area 10g3 is provided with at least two encapsulation dams 6 therein, the at least two encapsulation dams 6 are disposed along a radial direction of the through hole area 10d at intervals in sequence.

In some examples, as shown in FIG. 7, the at least one encapsulation dam 6 disposed in each encapsulation dam area 10g3 includes a first encapsulation dam 61 and a second encapsulation dam 62. The first encapsulation dam 61 is located on a side of the second encapsulation dam 62 away from the through hole area 10d.

A thickness of the second encapsulation dam 62 in a third direction Z is greater than a thickness of the first encapsulation dam 61 in the third direction Z. The third direction Z is perpendicular to the base substrate 2.

For example, as shown in FIG. 7, the second encapsulation dam 62 includes a first portion 62a, a second portion 62b and a first spacer 62c. The first portion 62a is disposed in a same layer as the planarization layer 5. The second portion 62b is disposed on a side of the first portion 62a away from the base substrate 2, and the second portion 62b is disposed in a same layer as the pixel defining layer 44. The first spacer 62c is disposed on a side of the second portion 62b away from the base substrate 2.

The first encapsulation dam 61 includes a third portion 61a and a second spacer 61b. The third portion 61a is disposed in a same layer as the pixel defining layer 44. The second spacer 61b is disposed on a side of the third portion 61a away from the base substrate 2, and the second spacer 61b is made of a same material and disposed in a same layer as the first spacer 62c.

In some examples, as shown in FIG. 7, the hole transport layer and the electron transport layer in the functional layer 42 and the second electrode layer 43 are further located in the encapsulation dam area 10g3, and the functional layer 42 and the second electrode layer 43 are sequentially stacked on a side of the plurality of encapsulation dams 6 away from the base substrate 2.

In some embodiments, as shown in FIG. 7, the display substrate 100 further includes at least one first isolation area 10g1 and at least one second isolation area 10g2. Each first isolation area 10g1 is located between a wiring area 10c and a encapsulation dam area 10g3, and surrounds the encapsulation dam area 10g3. Each second isolation area 10g2 is located between a through hole area 10d and a encapsulation dam area 10g3, and surrounds the through hole area 10d. For example, the display substrate 100 includes two first isolation areas 10g1 and two second isolation areas 10g2.

The first insulating layer 321, the second insulating layer 322, and the interlayer insulating layer 323 are further located in the at least one first isolation area 10g1 and the at least one second isolation area 10g2.

Figure 19:
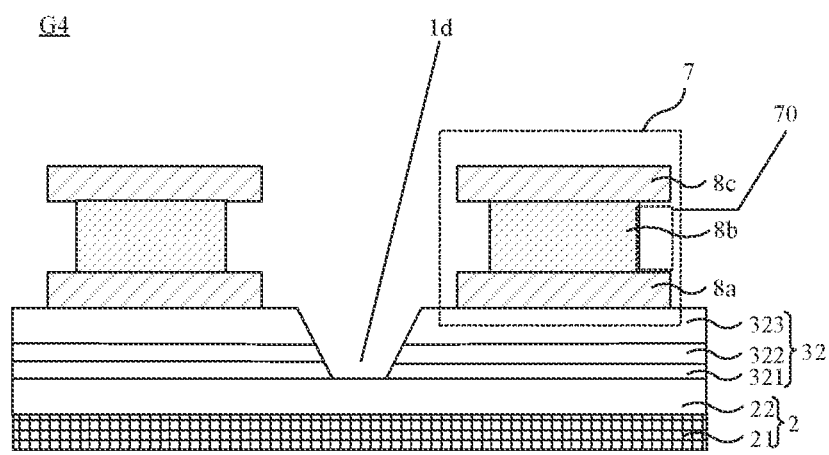
FIG. 19 is an enlarged view of the area G4 in FIG. 7.
Figure 20:
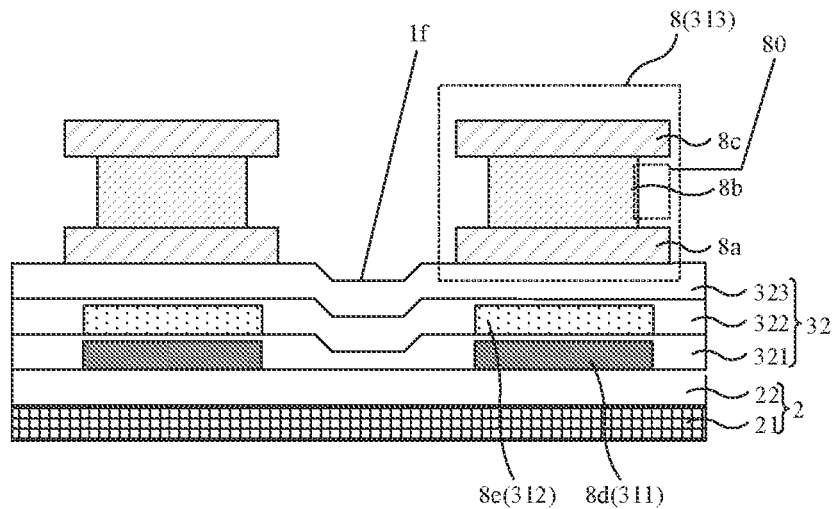
FIG. 20 is an enlarged view of the area G5 in FIG. 7.

As shown in FIGS. 7, 19 and 20, the display substrate 100 further includes one or more first isolation pillars 7 and one or more second isolation pillars 8.

Each first isolation area 10g1 is provided with at least one first isolation pillar 7 therein, and each first isolation pillar 7 surrounds a first encapsulation dam 61. In a case where each first isolation area 10g1 is provided with at least two first isolation pillars 7 therein, the at least two first isolation pillars 7 are disposed along the radial direction of the through hole area 10d at intervals in sequence.

Each second isolation area 10g2 is provided with at least one second isolation pillar 8 therein, and each second isolation pillar 8 surrounds a through hole area 10d. In a case where each second isolation area 10g2 is provided with at least two second isolation pillars 8 therein, the at least two second isolation pillars 8 are disposed along the radial direction of the through hole area 10d at intervals in sequence.

In some embodiments, as shown in FIG. 7, the first isolation pillars 7 and the second isolation pillars 8 are disposed on a side of the interlayer insulating layer 323 away from the base substrate 2. For example, the first isolation pillars 7 and the second isolation pillars 8 are located in the source-drain metal layer 313. The first isolation pillars 7 and the second isolation pillars 8 are arranged in a same layer as the plurality of data lines DL.

In some examples, as shown in FIG. 7. the hole transport layer and the electron transport layer in the functional layer 42 and the second electrode layer 43 are further located in the at least one first isolation area 10g1 and the at least one second isolation area 10g2, and the functional layer 42 and the second electrode layer 43 are sequentially stacked on a side of the plurality of first isolation pillars 7 and the plurality of second isolation pillars 8 away from the base substrate 2.

The at least one first isolation pillar 7 and the at least one second isolation pillar 8 may obstruct the organic light-emitting materials (e.g., materials of the hole transport layer and the electron transport layer), so as to prevent moisture and oxygen from entering the light-emitting devices. As shown in FIG. 7, since the at least one first isolation pillar 7 has a certain thickness and is convex in the display substrate, when the functional layer 42 is formed, the hole transport layer and the electron transport layer in the functional layer 42 will be obstructed at the first isolation pillar 7, so that the functional layer 42 is discontinuous. In this way, it may be possible to prevent the moisture and oxygen that has entered the functional layer 42 through the through hole area 10d from entering the light-emitting devices (e.g., the light-emitting portions 421 in the light-emitting devices) in the display area 10a and thus affecting the display effect.

As a possible design, as shown in FIGS. 19 and 20, a side wall of the first isolation pillar 7 is provided with a first groove 70, and a side wall of the second isolation pillar 8 is provided with a second groove 80. For example, the first isolation pillar 7 and the second isolation pillar 8 both include a first metal pattern 8a, a second metal pattern 8b and a third metal pattern 8c that are sequentially stacked. An outer boundary of an orthographic projection of the second metal pattern 8b on the base substrate 2 is located within outer boundaries of orthographic projections of the first metal pattern 8a and the third metal pattern 8c on the base substrate 2, so as to form the first groove 70 on the side wall of each first isolation pillar 7 and the second groove 80 on the side wall of each second isolation pillar 8.

In some embodiments, in a case where each data line DL includes a first data line pattern DL1, a second data line pattern DL2, and a third data line pattern DL3 that are sequentially stacked, the first metal pattern 8a and the first data line pattern DL1 are disposed in a same layer, the second metal pattern 8b and the second data line pattern DL2 are disposed in a same layer, and the third metal pattern 8c and the third data line pattern DL3 are disposed in a same layer. The first metal pattern 8a and the third metal pattern 8c are made of titanium, and the second metal pattern 8b is made of aluminum, so that each first isolation pillar 7 and each second isolation pillar 8 has a titanium-aluminum-titanium (Ti/Al/Ti) structure. In this way, the plurality of data lines DL, the first isolation pillars 7 and the second isolation pillars 8 may be manufactured by a same patterning process, which may help simplify the manufacturing process.

In some embodiments, as shown in FIG. 20, each second isolation area 10g2 is further provided with at least one fourth metal pattern 8d and at least one fifth metal pattern 8e therein. The fourth metal pattern 8d is located in the first gate layer 311, and the fifth metal pattern 8e is located in the second gate layer 312. Each fourth metal pattern 8d and each fifth metal pattern 8e surround a through hole area 10d.

Orthographic projections of the second isolation pillar 8, the fourth metal pattern 8d, and the fifth metal pattern 8e on the base substrate 2 have a common overlapping area. For example, the number of the at least one fourth metal pattern 8d is equal to the number of the at least one fifth metal pattern 8e and the number of the at least one second isolation pillar 8. A fifth metal pattern 8e is disposed directly below each second isolation pillar 8, and a single fourth metal pattern 8d is disposed directly below each fifth metal pattern 8e.

The at least one fourth metal pattern 8d and the at least one fifth metal pattern 8e are used to raise the second isolation pillars 8, and may also reduce the occurrence of cracks in the base substrate 2.

In some embodiments, as shown in FIG. 19, in the case where each first isolation area 10g1 is provided with at least two first isolation pillars 7 therein, a portion of the driving circuit layer 3 that is located between two adjacent first isolation pillars 7 has a slot 1d. For example, the slot 1d exposes the base substrate 2.

In some examples, after the first insulating layer 321, the second insulating layer 322, and the interlayer insulating layer 323 in the driving circuit layer 3 are fabricated, portions of the first insulating layer 321, the second insulating layer 322, and the interlayer insulating layer 323 located between two adjacent first isolation pillars 7 are removed by an etching process, so as to expose the base substrate 2 to form the slot 1d. In some other examples, it may also be that only a portion of the interlayer insulating layer 323 located between two adjacent first isolation pillars 7 is removed, so as to expose the second insulating layer 322. Or, it may also be that only portions of the interlayer insulating layer 323 and the second insulating layer 322 located between two adjacent first isolation pillars 7 are removed, so as to expose the first insulating layer 321 to form a relatively shallow slot 1d.

As shown in FIG. 20, in the case where each second isolation area 10g2 is provided with at least two second isolation pillars 8 therein, a portion of the driving circuit layer 3 located between two adjacent second isolation pillars 8 has a recess 1f.

Since each second isolation area 10g2 is further provided with fourth metal patterns 8d and fifth metal patterns 8e therein, and the fourth metal pattern 8d and the fifth metal pattern 8e are disposed directly below the second isolation pillar 8, after the fourth metal pattern 8d is formed, in a process of depositing the second insulating layer 322, a natural recess is formed between two adjacent fourth metal patterns 8d, and then the fifth metal pattern 8e is formed; and in a process of depositing the interlayer insulation layer 323, a natural recess is formed between two adjacent fifth metal patterns 8e, and there is no need to etch the insulating layer.

In some embodiments, as shown in FIGS. 7 and 15 to 18, the display substrate 100 further includes an encapsulation layer 9 disposed on a side of the light-emitting device layer 4 away from the base substrate 2.

The encapsulation layer 9 includes a first inorganic encapsulation film layer 91, an organic encapsulation film layer 92 and a second inorganic encapsulation film layer 93.

The first inorganic encapsulation film layer 91 is disposed on the side of the light-emitting device layer 4 away from the base substrate 2; and the first inorganic encapsulation film layer 91 is located in the at least one second isolation area 10g2, the at least one encapsulation dam area 10g3, the at least one first isolation area 10g1 the at least two wiring areas 10c, the hole border area 10f, the display area 10a and the at least one blind hole area 10e. The organic encapsulation film layer 92 is disposed on a side of the first inorganic encapsulation film layer 91 away from the base substrate 2; and the organic encapsulation film layer 92 is located in the at least one encapsulation dam area 10g3, the at least one first isolation area 10g1, the at least two wiring areas 10c, the hole border area 10f, the display area 10a and the at least one blind hole area 10e. The second inorganic encapsulation film layer 93 is disposed on a side of the organic encapsulation film layer 92 away from the base substrate 2; and the second inorganic encapsulation film layer 93 is located in the at least one second isolation area 10g2, the at least one encapsulation dam area 10g3, the at least one first isolation area 10g1, the at least two wiring areas 10c, the hole border area 10f, the display area 10a, and the at least one blind hole area 10e.

As shown in FIGS. 7 and 14A, film structures in the blind hole area 10e includes portions, located in the blind hole area 10e, of the base substrate 2, the first insulating layer 321, the second insulating layer 322, the interlayer insulating layer 323, the planarization layer 5 and the encapsulation layer 9. In some embodiments, layers in the blind hole area 10e may be etched to retain some of the film structures. For example, film layers in the blind hole area 10e may include portion(s), located in the blind hole area 10e, of one or more of the base substrate 2, the first insulating layer 321, the second insulating layer 322, the interlayer insulating layer 323, the planarization layer 5 and the encapsulation layer 9. For example, film layers in the blind hole area 10e only include portions, located in the blind hole area 10e, of the base substrate 2, the first insulating layer 321, the second insulating layer 322, the interlayer insulating layer 323, or only include portions, located in the blind hole area 10e, of the base substrate 2, the first insulating layer 321, the second insulating layer 322, the interlayer insulating layer 323, and the planarization layer 5. Generally, the layers shown in FIG. 4 are retained in the blind hole area 10e to ensure that a thickness of the display substrate does not change much, so as to avoid bubbles between the layers when a bonding process is used to bond the layers. Light passes through the layers along a light-incident direction and reaches a sensor corresponding to the blind hole.

In order to ensure a certain light transmittance of the blind hole area 10e, it is required that the base substrate 2, the first insulating layer 321, the second insulating layer 322, the interlayer insulating layer 323, the planarization layer 5 and the encapsulation layer 9 are all made of transparent materials. For example, the base substrate 2 may be made of an organic material such as polyimide; and the first insulating layer 321, the second insulating layer 322, and the interlayer insulating layer 323 may be made of silicon oxide, silicon oxynitride, and other materials. The planarization layer 5 may be made of an organic material, such as photoresist, acrylic-based polymer, silicon-based polymer, etc. The first inorganic encapsulation film layer 91 and the second inorganic encapsulation film layer 93 of the encapsulation layer 9 are used to prevent moisture and oxygen from entering the light-emitting devices in the display area 10a from a display side of the display substrate 100 and the through hole area 10d. The first inorganic encapsulation film layer 91 and the second inorganic encapsulation film layer 93 may be made of an inorganic material such as silicon nitride and silicon oxide, etc. The organic encapsulation film layer 92 is used to achieve a planarization effect, so as to facilitate manufacture of the second inorganic encapsulation film layer 93. The organic encapsulation film layer 92 may be made of acrylic-based polymer, silicon-based polymer, and other materials.

Some embodiments of the present disclosure further provide a display apparatus 1000. The display apparatus 1000 includes the display substrate 100 as described in the above embodiments and a driving circuit for driving the display substrate.

In some embodiments, as shown in FIG. 6, the display apparatus 1000 further includes at least one first sensor 200 and at least one second sensor 300.

Each first sensor 200 is disposed in a through hole area 10d; the first sensor 200 is at least partially located inside a through hole 10 in the through hole area 10d, and the first sensor 200 is disposed directly opposite to the through hole in the through hole area 10b. For example, as shown in FIG. 6, the display substrate 100 has a display surface side B and a non-display surface side B' that are opposite to each other. The first sensor 200 is located on the non-display surface side B' of the display substrate 100 and may extend into the through hole. The at least one first sensor 200 is a component that requires high light transmittance. For example, the first sensor 200 includes a camera.

Each second sensor 300 is disposed in a blind hole area 10e; each second sensor 300 is disposed directly opposite to a blind hole in the at least one blind hole area 10e, and the second sensor 300 is located on the non-display surface side B' of the display substrate 100. The at least one second sensor 300 is a component that requires low light transmittance. For example, the second sensor 300 includes at least one of an infrared sensor, a proximity optical sensor, a flood illuminator, and an ambient light sensor.

For example, sensing surfaces of the at least one first sensor 200 and the at least one second sensor 300 both face the display surface side B of the display substrate 100, so as to receive light from the display surface side B of the display substrate 100.

Compared with a design in the related art that only through holes (for placing cameras) are provided or through holes are combined with sensors arranged in a bezel, the display apparatus 1000 provided herein may be possible to ensure the quality of the function of the sensors, and facilitate the realization of a narrow bezel. Compared with a traditional design that only blind holes are provided or the blind holes are combined with sensors arranged in a bezel, the display apparatus 1000 provided herein may be better at improving the image quality of cameras and realizing a narrow bezel.

Figure 21:
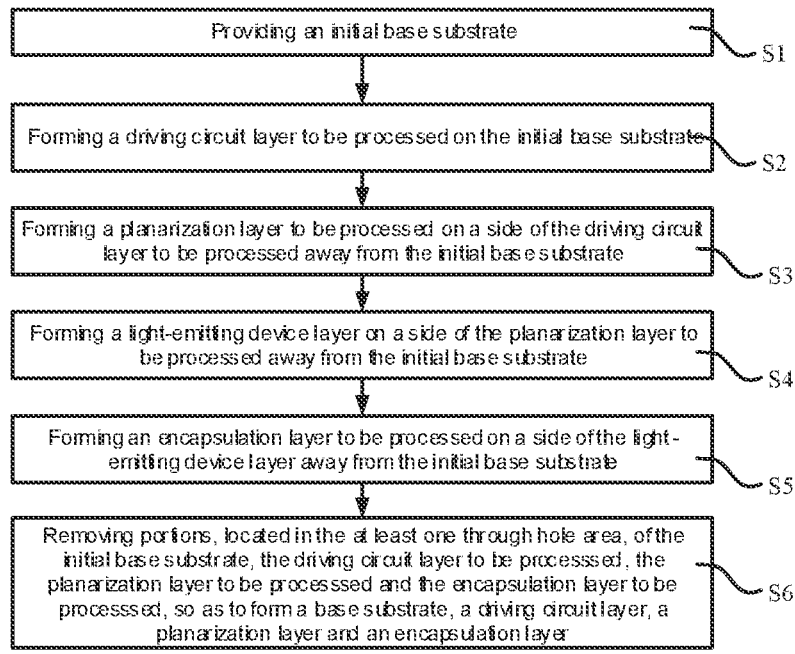
FIG. 21 is a flow diagram of a method for manufacturing a display substrate, in accordance with some embodiments of the present disclosure.

Some other embodiments of the present disclosure further provide a method for manufacturing a display substrate. As shown in FIG. 21, the method includes S1 to S6.

In S1, an initial base substrate is provided. The initial base substrate includes a display area 10a, at least two wiring areas 10c, at least one through hole area 10d, and at least one blind hole area 10e. Each through hole area 10d and each blind hole area 10e are both surrounded by a respective wiring area 10c of the at least two wiring areas 10c, and the display area 10a surrounds the at least two wiring areas 10c.

In some embodiments, the initial base substrate further includes a hole border area 10f located between the wiring areas 10c and the display area 10a. That is, the hole border area 10f surrounds the wiring areas 10c, and the display area 10a surrounds the hole border area 10f.

It will be noted that, the display area 10a, the wiring areas 10c, the hole border area 10f the through hole area 10d, and the blind hole area 10e in the initial base substrate are consistent with the display area 10a, the wiring areas 10c, the hole border area 10f, the through hole area 10d, and the blind hole area 10e in the display substrate 100 to be formed.

In S2, a driving circuit layer to be processed is formed on the initial base substrate. The driving circuit layer to be processed includes at least one metal layer to be processed and at least one insulating layer to be processed.

The at least one metal layer to be processed is at least located in the display area 10a, the wiring areas 10c, and the hole border area 10f. The at least one metal layer to be processed includes a plurality of signal lines, and at least a portion of at least one signal line of the plurality of signal lines makes a detour around the through hole area(s) 10d and/or the blind hole area(s) 10e.

For example, the plurality of signal lines include a plurality of data lines DL, a plurality of light-emitting control signal lines EL, a plurality of gate drive signal lines GL, and a plurality of initialization signal lines VINT. As for a specific arrangement of the plurality of signal lines, reference may be made to FIGS. 8A to 8C and the foregoing description, and details will not be repeated here.

The at least one insulating layer to be processed is located in the display area 10a, the wiring areas 10c, the at least one through hole area 10d, the at least one blind hole area 10e, and the hole border area 10f.

In some examples, as shown in FIG. 7, the at least one metal layer to be processed includes a first gate layer 311, a second gate layer 312, and a source-drain metal layer to be processed; and the at least one insulating layer to be processed includes a first insulating layer to be processed, a second insulating layer to be processed and an interlayer insulating layer to be processed. The driving circuit layer to be processed further includes a semiconductor layer 33; the semiconductor layer 33 is located in the display area 10a and the hole border area 10f.

The step of forming the driving circuit layer to be processed on the initial base substrate (S2) includes S21 to S27.

In S21, the semiconductor layer 33 is formed on the initial base substrate.

In S22, the first insulating layer to be processed is formed on a side of the semiconductor layer 33 away from the initial base substrate.

In S23, the first gate layer 311 is formed on a side of the first insulating layer to be processed away from the initial base substrate.

In S24, the second insulating layer to be processed is formed on a side of the first gate layer 311 away from the initial base substrate.

In S25, the second gate layer 312 is formed on a side of the second insulating layer to be processed away from the initial base substrate.

In S26, the interlayer insulating layer to be processed is formed on a side of the second gate layer 312 away from the initial base substrate.

In S27, the source-drain metal layer to be processed is formed on a side of the interlayer insulating layer to be processed away from the initial base substrate.

The semiconductor layer 33, the first insulating layer to be processed, the second insulating layer to be processed, and the interlayer insulating layer to be processed each may be fabricated by a deposition process. The first gate layer 311, the second gate layer 312, and the source-drain metal layer to be processed each may be fabricated by using a sputtering process to form a metal layer, and then using an etching process to form a plurality of patterns.

In the display area 10a, the driving circuit layer to be processed includes a plurality of pixel circuits 11, and each pixel circuit 11 includes at least one thin film transistor. In the hole border area 10f, the driving circuit layer to be processed includes a plurality of redundant pixel circuits 11', and each redundant pixel circuit 11' includes at least one thin film transistor.

In some embodiments, the at least one metal layer to be processed is further located in the through hole area 10d, so as to form redundant pixel circuits 11' in the through hole area 10d. By providing redundant pixel circuits 11' in the through hole area 10d, it may be possible to make the thickness of the display substrate 100 uniform, so that the display substrate may be uniformly cut in a subsequent process of cutting the display substrate in the through hole area 10d.

The first gate layer 311 formed in S23 includes a plurality of gate scan signal lines GL, a plurality of light-emitting control signal lines EL, and gates of a plurality of thin film transistors. The plurality of gate scan signal lines GL, the plurality of light-emitting control signal lines EL, and the gates of the plurality of thin film transistors are formed by a same patterning process. The second gate layer 312 formed in S25 includes a plurality of initialization signal lines VINT, and the plurality of initialization signal lines VINT are formed by a same patterning process. The source-drain metal layer to be processed formed in S27 includes a plurality of data lines DL and sources and drains of the plurality of thin film transistors, and the plurality of data lines DL and the sources and drains of the plurality of thin film transistors are formed by a same patterning process.

In S3, a planarization layer to be processed is formed on a side of the driving circuit layer to be processed away from the initial base substrate. The planarization layer to be processed is located in the display area 10a, the wiring areas 10c, the at least one through hole area 10d and the at least one blind hole area 10e, and the hole border area 10f.

For example, a material of the planarization layer to be processed is coated on a side of the source-drain metal layer to be processed away from the initial base substrate by using a coating process. For example, the material of the planarization layer to be processed includes photoresist, acrylic-based polymer, silicon-based polymer, etc.

In S4, a light-emitting device layer 4 is formed on a side of the planarization layer to be processed away from the initial base substrate. The light-emitting device layer 4 is at least located in the display area 10a.

In some examples, the light-emitting device layer 4 includes a first electrode layer 41, a functional layer 42, a second electrode layer 43 and a pixel defining layer 44.

The step of forming the light-emitting device layer 4 on the side of the planarization layer to be processed away from the initial base substrate (S4) includes S41 to S44.

In S41, the first electrode layer 41 is formed on the side of the planarization layer to be processed away from the initial base substrate. The first electrode layer 41 includes a plurality of first electrodes 411, and each first electrode 411 is electrically connected to a thin film transistor in the driving circuit layer to be processed through a via hole penetrating the planarization layer to be processed.

In S42, the pixel defining layer 44 is formed on a side of the first electrode layer 41 away from the initial base substrate. A plurality of openings K1 are formed in the pixel defining layer 44, and each opening K1 exposes at least a portion of a first electrode 411.

In some examples, the pixel defining layer 44 may also be formed in the hole border area 10f, and the pixel defining layer located in the hole border area 10f may not be provided with a plurality of openings K1.

In S43, the functional layer 42 is formed on the side of the first electrode layer 41 away from the initial base substrate. The functional layer 42 includes a plurality of light-emitting portions 421, and each light-emitting portion 421 is located in an opening K1.

In S44 the second electrode layer 43 is formed on a side of the functional layer 42 and the pixel defining layer 44 away from the initial base substrate.

In the display area 10a, the light-emitting device layer 4 includes a plurality of light-emitting devices 12, and each light-emitting device 12 includes a first electrode 411 electrically connected to the pixel circuit 11, a first light-emitting portion 421a in the light-emitting portions 421, and a portion of the second electrode layer 43 corresponding to the first light-emitting portion 421a. In the hole border area 10f, the light-emitting device layer 4 includes a plurality of redundant light-emitting devices 12', and each redundant light-emitting device 12' includes a second light-emitting portion 421b in the light-emitting portions 421 and a portion of the second electrode layer 43 corresponding to the second light-emitting portion 421b. Or, as shown in FIG. 18, the redundant light-emitting device 12' includes a first electrode 411. a second light-emitting portion 421b in the light-emitting portions 421 and a portion of the second electrode layer 43 corresponding to the second light-emitting portion 421b, and the first electrode 411 is not electrically connected to the redundant pixel circuit 11'.

In S5, an encapsulation layer to be processed is formed on a side of the light-emitting device layer 4 away from the initial base substrate. The encapsulation layer to be processed is located in the display area 10a, the wiring areas 10c, the at least one through hole area 10d, the at least one blind hole area 10e, and the hole border area 10f.

The encapsulation layer to be processed includes a first inorganic encapsulation film layer to be processed, an organic encapsulation film layer 92 and a second inorganic encapsulation film layer to be processed.

The step of forming the encapsulation layer to be processed on the side of the light-emitting device layer 4 away from the initial base substrate (S5) includes S51 to S53.

In S51, the first inorganic encapsulation film layer to be processed is formed on a side of the light-emitting device layer 4 away from the initial base substrate.

In S52, the organic encapsulation film layer 92 is formed on a side of the first inorganic encapsulation film layer to be processed away from the initial base substrate.

In S53, the second inorganic encapsulation film layer to be processed is formed on a side of the organic encapsulation film layer 92 away from the initial base substrate.

In S6, portions, located in the at least one through hole area 10d, of the initial base substrate, the driving circuit layer to be processed, the planarization layer to be processed and the encapsulation layer to be processed are removed, so as to form a base substrate 2, a driving circuit layer 3, a planarization layer 5 and an encapsulation layer 9.

For example, a laser cutting or mechanical punching process may be used to cut the film layers in the through hole area 10d, so as to obtain the display substrate 100 with the through holes.

As shown in FIGS. 4 and 5, before the display substrate 100 is cut, a positioning mark structure M is further provided on the display substrate in the through hole area 10d for positioning and cutting. The positioning mark structure M is located in the source-drain metal layer 313, and may be formed together with the plurality of data lines DL and the sources and the drains of the thin film transistors by a same patterning process. There are no redundant pixel circuits 11' at a position of the positioning mark structure M.

In some embodiments, S6 further includes removing a portion of the encapsulation layer to be processed located in the blind hole area 10e. Or, S6 further includes removing a portion of an insulating layer to be processed of the at least one insulating layer to be processed in the driving circuit layer to be processed that is located in the blind hole area 10e. For example, a portion of the interlayer insulating layer to be processed located in the blind hole area 10e is removed, so that the film layers in the blind hole area 10e is thin and the light transmittance is high.

In some embodiments, as shown in FIGS. 3 to 5 and 7, the initial base substrate further includes at least one encapsulation dam area 10g3, at least one first isolation area 10g1, and at least one second isolation area 10g2. Each encapsulation dam area is located between a through hole area and a wiring area surrounding the through hole area, and surrounds the through hole area. Each first isolation area is disposed between a wiring area and a encapsulation dam area, and surrounds the encapsulation dam area; and each second isolation area is disposed between a through hole area and a encapsulation dam area, and surrounds the through hole area.

In the step (S2) of forming the driving circuit layer to be processed on the initial base substrate, the formed at least one insulating layer to be processed is further located in the at least one encapsulation dam area 10g3, the at least one first isolation area 10g1, and the at least one second isolation area 10g2. In the step (S3) of forming the planarization layer to be processed, the formed planarization layer to be processed is further located in the at least one encapsulation dam area 10g3, the at least one first isolation area 10g1, and the at least one second isolation area 10g2.

In some embodiments, the source-drain metal layer to be processed formed in S27 further includes one or more first isolation pillars 7 and one or more second isolation pillars 8. That is, the first isolation pillar(s) 7, the second isolation pillar(s) 8 and the plurality of data lines DL are formed by a same patterning process. Each first isolation area 10g1 is provided with at least one first isolation pillar 7, and each first isolation pillar 7 is disposed to surround the first encapsulation dam 61; each second isolation area 10g2 is provided with at least one second isolation pillar 8, and each second isolation pillar 8 is disposed to surround the through hole area 10d.

The first isolation pillar 7 and the second isolation pillar 8 both include a first metal pattern 8a, a second metal pattern 8b and a third metal pattern 8c that are sequentially stacked. An outer boundary of an orthographic projection of the second metal pattern 8b on the base substrate 2 is located within outer boundaries of orthographic projections of the first metal pattern 8a and the third metal pattern 8c on the base substrate 2, so as to form first groove 70 on the side wall of each first isolation pillar 7 and second groove 80 on the side wall of each second isolation pillar 8. In a process of forming the plurality of first isolation pillars 7 and the plurality of second isolation pillars 8 in S27, layers in which the first metal pattern 8a, the second metal pattern 8b, and the third metal pattern 8c are located are sequentially formed, and the layers are etched in sequence, so that an area of each second metal pattern 8*b* is smaller than an area of the first metal pattern 8*a* and an area of the third metal pattern 8*c*.

In some examples, an etching process is used to remove portions, located between two adjacent first isolation pillars 7, of the first insulating layer to be processed, the second insulating layer to be processed, and the interlayer insulating layer to be processed, so as to expose the initial base substrate to form a slot id between the two adjacent first isolation pillars 7.

In some embodiments, the method for manufacturing the display substrate 100 further includes a step of forming one or more encapsulation dams 6. Each encapsulation dam area 10*g*3 is provided with at least one encapsulation dam 6; each encapsulation dam 6 surrounds a through hole area 10*d*, and the encapsulation dam 6 is disposed on a side of the driving circuit layer 3 away from the base substrate 2.

In S3, when the planarization layer to be processed is formed on the side of the driving circuit layer to be processed away from the initial base substrate, the step further includes forming a first portion 62*a* of at least one second encapsulation dam 62 of the encapsulation dam 6 simultaneously. The first portion 62*a* is disposed in a same layer as the planarization layer to be processed.

For example, as shown in FIG. 7, the formed second encapsulation dam 62 includes the first portion 62*a*, a second portion 62*b* and a first spacer 62*c*. The first portion 62*a* is disposed in a same layer as the planarization layer to be processed. The second portion 62*b* is disposed on a side of the first portion 62*a* away from the initial base substrate, and the second portion 62*b* is disposed in a same layer as the pixel defining layer 44. The first spacer 62*c* is disposed on a side of the second portion 62*b* away from the initial base substrate.

The formed first encapsulation dam 61 includes a third portion 61*a* and a second spacer 61*b*. The third portion 61*a* is disposed in a same layer as the pixel defining layer 44. The second spacer 61*b* is disposed on a side of the third portion 61*a* away from the initial base substrate, and the second spacer 61*b* is made of a same material and disposed in a same layer as the first spacer 62*c*.

In the step of forming the encapsulation layer to be processed on the side of the light-emitting device layer 4 away from the initial base substrate (S5), the first inorganic encapsulation film layer to be processed is further located in the second isolation area 10*g*2; the encapsulation dam area 10*g*3 and the first isolation area 10*g*1; the organic encapsulation film layer 92 is further located in the encapsulation dam area 10*g*3 and the first isolation area 10*g*1; and the second inorganic encapsulation film layer to be processed is located in the second isolation area 10*g*2, the encapsulation dam area 10*g*3 and the first isolation area 10*g*1.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate having a display area, the display area having an enclosed area, the enclosed area including a hole border area, at least two wiring areas, at least one through hole area, and at least one blind hole area, the blind hole area being light-transmitting; a blind hole being provided in each blind hole area, each through hole area and each blind hole area being both surrounded by a respective wiring area of the at least two wiring areas, the hole border area surrounding the wiring areas, and the display area surrounding the hole border area, the display substrate comprising:
   a base substrate, the base substrate having a through hole in each through hole area; and
   a driving circuit layer disposed on the base substrate, wherein the driving circuit layer includes:
      at least one metal layer located in the display area, the hole border area and the wiring areas, the at least one metal layer including a plurality of signal lines, a first gate layer, a second gate layer, and a source-drain metal layer, and the plurality of signal lines being disposed to avoid the at least one through hole area and the at least one blind hole area;
      at least one insulating layer located in the display area, the hole border area, the wiring areas and the at least one blind hole area, the at least one insulating layer includes a first insulating layer, a second insulating layer, and an interlayer insulating layer; and
      a semiconductor layer located in the display area and the hole border area, wherein
      the semiconductor layer is disposed on a side of the base substrate;
      the first insulating layer is disposed on a side of the semiconductor layer away from the base substrate;
      the first gate layer is disposed on a side of the first insulating layer away from the base substrate;
      the second insulating layer is disposed on a side of the first gate layer away from the base substrate;
      the second gate layer is disposed on a side of the second insulating layer away from the base substrate;
      the interlayer insulating layer is disposed on a side of the second gate layer away from the base substrate; and
      the source-drain metal layer is disposed on a side of the interlayer insulating layer away from the base substrate;
   wherein the display substrate further has at least one encapsulation dam area, each encapsulation dam area being located between a through hole area of the at least one through hole area and the wiring area of the at least two wiring areas surrounding the through hole area, and surrounding the through hole area of the at least one through hole area, wherein the first insulating layer, the second insulating layer, and the interlayer insulating layer are further located in the at least one encapsulation dam area; and
   the display substrate further comprises:
      one or more encapsulation dams, wherein each encapsulation dam area is provided with at least one encapsulation dam therein, the encapsulation dam surrounds the through hole area of the at least one through hole area, and the encapsulation dam is disposed on a side of the driving circuit layer away from the base substrate, wherein
      the at least one encapsulation dam includes one encapsulation dam; or
      the at least one encapsulation dam includes at least two encapsulation dams, the at least two encapsulation dams are disposed along a radial direction of the through hole area of the at least one through hole area at intervals in sequence.

2. The display substrate according to claim 1, wherein the at least one through hole area includes two through hole areas, the at least one blind hole area includes one blind hole area, and the one blind hole area is disposed between the two through hole areas.

3. The display substrate according to claim 1, wherein the through hole area is in a shape of a circle or a quasi-ellipse; and
the blind hole area is in a shape of a rectangle, a rectangle with rounded corners, a shape formed by splicing rectangles with different widths together along a length direction thereof, or a shape formed by splicing rectangles with rounded corners with different widths together along a length direction thereof.

4. The display substrate according to claim 1, wherein the plurality of signal lines include a plurality of data lines and a plurality of gate drive signal lines;
the plurality of gate drive signal lines extend along a first direction as a whole, and the plurality of data lines extend along a second direction as a whole, wherein the first direction intersects the second direction;
at least one data line includes a portion located in a wiring area of the at least two wiring areas and making a detour around a through hole area of the at least one through hole area surrounded by the wiring area of the at least two wiring areas and/or a portion located in a wiring area of the at least two wiring areas and making a detour around a blind hole area of the at least one blind hole area surrounded by the wiring area of the at least two wiring areas; and
at least one gate drive signal line includes a portion located in the wiring area of the at least two wiring areas and making a detour around a through hole area of the at least one through hole area surrounded by the wiring area and/or a portion located in the wiring area of the at least two wiring areas and making a detour around a blind hole area of the at least one blind hole area surrounded by the wiring area of the at least two wiring areas.

5. The display substrate according to claim 4, wherein the plurality of signal lines further include a plurality of initialization signal lines;
the plurality of initialization signal lines extend along the first direction as a whole;
at least one initialization signal line includes a portion located in the wiring area of the at least two wiring areas and making a detour around a through hole area of the at least one through hole area surrounded by the wiring area of the at least two wiring areas and/or a portion located in the wiring area of the at least two wiring areas and making a detour around a blind hole area of the at least one blind hole area surrounded by the wiring area of the at least two wiring areas; and/or
the plurality of signal lines further include a plurality of light-emitting control signal lines;
the plurality of light-emitting control signal lines extend along the first direction as a whole;
at least one light-emitting control signal line includes a portion located in the wiring area of the at least two wiring areas and making a detour around a through hole area of the at least one through hole area surrounded by the wiring area of the at least two wiring areas and/or a portion located in the wiring area of the at least two wiring areas and making a detour around a blind hole area of the at least one blind hole area surrounded by the wiring area of the at least two wiring areas; or, at least one light-emitting control signal line includes a portion located in the display area and the hole border area, and is cut off at a position, to which the light-emitting control signal line extends along the first direction, of a through hole area of the at least one through hole area and/or a blind hole area of the at least one blind hole area.

6. The display substrate according to claim 1, wherein the plurality of signal lines include a plurality of data lines, a plurality of light-emitting control signal lines, a plurality of gate drive signal lines, and a plurality of initialization signal lines, wherein
the plurality of data lines are located in the source-drain metal layer;
the plurality of light-emitting control signal lines and the plurality of gate drive signal lines are located in one of the first gate layer and the second gate layer; and
the plurality of initialization signal lines are located in another of the first gate layer and the second gate layer.

7. The display substrate according to claim 1, further comprising a light-emitting device layer disposed on a side of the driving circuit layer away from the base substrate, the light-emitting device layer being located in the display area and the hole border area, wherein
the light-emitting device layer includes:
a first electrode layer disposed on the side of the driving circuit layer away from the base substrate, the first electrode layer including a plurality of first electrodes;
a pixel defining layer disposed on a side of the first electrode layer away from the base substrate, the pixel defining layer being provided with a plurality of openings therein, and each opening exposing at least a portion of a first electrode;
a functional layer disposed on a side of the first electrode layer away from the base substrate, the functional layer including a plurality of light-emitting portions, and each light-emitting portion being located in an opening; and
a second electrode layer disposed on a side of the functional layer and the pixel defining layer away from the base substrate, wherein
the driving circuit layer includes a plurality of pixel circuits and a plurality of redundant pixel circuits;
the display area is provided with a plurality of pixel structures therein, and each pixel structure includes a pixel circuit of the plurality of pixel circuits and a light-emitting device; the light-emitting device includes a first electrode electrically connected to the pixel circuit, a first light-emitting portion in the plurality of light-emitting portions, and a portion of the second electrode layer corresponding to the first light-emitting portion; and
the hole border area is provided with a plurality of redundant pixel structures therein; each redundant pixel structure includes a redundant pixel circuit of the plurality of redundant pixel circuits and/or a redundant light-emitting device; the redundant light-emitting device includes a second light-emitting portion in the plurality of light-emitting portions and a portion of the second electrode layer corresponding to the second light-emitting portion; or, the redundant light-emitting device includes a first electrode, a second light-emitting portion in the plurality of light-emitting portions, and a portion of the second electrode layer corresponding to the second light-emitting portion; and the first electrode is not electrically connected to the redundant pixel circuit.

8. The display substrate according to claim 7, wherein each redundant pixel structure includes the redundant pixel circuit, the pixel circuit and the redundant pixel circuit both include at least one thin film transistor, each thin film transistor includes an active layer, a gate, a source, and a drain;

the active layer is located in the semiconductor layer, the gate is located in the first gate layer, and the source and the drain are located in the source-drain metal layer;

the hole border area includes a first sub-area proximate to a wiring area of the at least two wiring areas, and a second sub-area apart from the first sub-area; and the display substrate further comprises:

a plurality of via holes disposed in the second sub-area of the hole border area, each via hole penetrating the first insulating layer, the second insulating layer and the interlayer insulating layer, the plurality of redundant pixel circuits being disposed in the second sub-area of the hole border area, and the source and the drain of each thin film transistor in the plurality of redundant pixel circuits being electrically connected to the active layer thereof through via holes;

a plurality of redundant via holes disposed in the first sub-area of the hole border area, each redundant via hole penetrating the first insulating layer, the second insulating layer, and the interlayer insulating layer; and a planarization layer disposed between the driving circuit layer and the light-emitting device layer, the planarization layer being located in the display area, the hole border area, the wiring areas, and the at least one blind hole area, and portions of the planarization layer filling the plurality of redundant via holes.

9. The display substrate according to claim 8, wherein the at least two encapsulation dams provided in each encapsulation dam area includes a first encapsulation dam and a second encapsulation dam, and the first encapsulation dam is located on a side of the second encapsulation dam away from the through hole area of the at least one through hole area;

a thickness of the second encapsulation dam in a third direction is greater than a thickness of the first encapsulation dam in the third direction, the third direction is perpendicular to the base substrate; and the second encapsulation dam includes:
 a first portion, the first portion being disposed in a same layer as the planarization layer;
 a second portion disposed on a side of the first portion away from the base substrate, the second portion being disposed in a same layer as the pixel defining layer; and
 a first spacer disposed on a side of the second portion away from the base substrate; and the first encapsulation dam includes:
 a third portion, the third portion being disposed in a same layer as the pixel defining layer; and
 a second spacer disposed on a side of the third portion away from the base substrate, the second spacer being made of a same material and disposed in a same layer as the first spacer.

10. The display substrate according to claim 9, further having at least one first isolation area and at least one second isolation area, wherein the first insulating layer, the second insulating layer, and the interlayer insulating layer are further located in the at least one first isolation area and the at least one second isolation area;

each first isolation area is located between the wiring area of the at least two wiring areas and an encapsulation dam area, and surrounds the encapsulation dam area;

and each second isolation area is located between the through hole area of the at least one through hole area and the encapsulation dam area, and surrounds the through hole area of the at least one through hole area; and the display substrate further comprises:

one or more first isolation pillars, each first isolation area being provided with at least one first isolation pillar therein, each first isolation pillar being disposed to surround the first encapsulation dam and being disposed on the side of the interlayer insulating layer away from the base substrate, and a side wall of each first isolation pillar being provided with a first groove; and one or more second isolation pillars, each second isolation area being provided with at least one second isolation pillar therein, each second isolation pillar being disposed to surround the through hole area of the at least one through hole area and being disposed on the side of the interlayer insulating layer away from the base substrate, and a side wall of each second isolation pillar being provided with a second groove.

11. The display substrate according to claim 10, wherein the at least one first isolation pillar and the at least one second isolation pillar are located in the source-drain metal layer.

12. The display substrate according to claim 10, wherein each first isolation pillar and each second isolation pillar both include a first metal pattern, a second metal pattern, and a third metal pattern that are sequentially stacked; an outer boundary of an orthographic projection of the second metal pattern on the base substrate is located with outer boundaries of orthographic projections of the first metal pattern and the third metal pattern on the base substrate, so as to form the first groove on the side wall of each first isolation pillar and the second groove on the side wall of each second isolation pillar.

13. The display substrate according to claim 10, wherein each second isolation area is further provided with at least one fourth metal pattern and at least one fifth metal pattern therein; the fourth metal pattern is located in the first gate layer, and the fifth metal pattern is located in the second gate layer;

each fourth metal pattern and each fifth metal pattern surround the through hole area of the at least one through hole area;

orthographic projections of a second isolation pillar, a fourth metal pattern corresponding to the second isolation pillar, and a fifth metal pattern corresponding to the second isolation pillar on the base substrate have a common overlapping area.

14. The display substrate according to claim 10, wherein each first isolation area is provided with at least two first isolation pillars therein, the at least two first isolation pillars are disposed along the radial direction of the through hole area of the at least one through hole area at intervals in sequence;

a portion, located between two adjacent first isolation pillars, of the driving circuit layer has a slot, and the slot exposes the base substrate; and each second isolation area is provided with at least two second isolation pillars therein, the at least two second isolation pillars are disposed along the radial direction of the through hole area of the at least one through hole area at intervals in sequence; and a portion, located between two adjacent second isolation pillars, of the driving circuit layer has a recess.

15. The display substrate according to claim 10, further comprising:
an encapsulation layer disposed on a side of the light-emitting device layer away from the base substrate, wherein
the encapsulation layer includes:
a first inorganic encapsulation film layer disposed on the side of the light-emitting device layer away from the base substrate, the first inorganic encapsulation film layer being located in the at least one second isolation area, the at least one encapsulation dam area, the at least one first isolation area, the wiring areas, the hole border area, the display area, and the at least one blind hole area;
an organic encapsulation film layer disposed on a side of the first inorganic encapsulation film layer away from the base substrate, the organic encapsulation film layer being located in the at least one encapsulation dam area, the at least one first isolation area, the wiring areas, the hole border area, the display area and the at least one blind hole area; and
a second inorganic encapsulation film layer disposed on a side of the organic encapsulation film layer away from the base substrate, the second inorganic encapsulation film layer being located in the at least one second isolation area, the at least one encapsulation dam area, the at least one first isolation area, the wiring areas, the hole border area, the display area and the at least one blind hole area.

16. A display apparatus, comprising:
the display substrate according to claim 1;
at least one first sensor, each first sensor being disposed in a through hole area of the at least one through hole area; and
at least one second sensor, each second sensor being disposed in a blind hole area of the at least one blind hole area.

17. The display apparatus according to claim 16, wherein the at least one first sensor includes a camera, and the at least one second sensor includes at least one of an infrared sensor, a proximity optical sensor, a flood illuminator, or an ambient light sensor.

18. A method for manufacturing a display substrate, comprising:
providing an initial base substrate, the initial base substrate including a display area, a hole border area, at least two wiring areas, at least one through hole area, and at least one blind hole area, each through hole area and each blind hole area being both surrounded by a respective wiring area of the at least two wiring areas, the hole border area surrounding the wiring areas, and the display area surrounding the hole border area;
forming a driving circuit layer to be processed on the initial base substrate, the driving circuit layer to be processed including:
at least one metal layer to be processed at least located in the display area, the hole border area and the wiring areas, the at least one metal layer to be processed including a plurality of signal lines, and the plurality of signal lines being disposed to avoid the at least one through hole area and the at least one blind hole area, the at least one metal layer to be processed including a first gate layer, a second gate layer, and a source-drain metal layer to be processed;
at least one insulating layer to be processed located in the display area, the hole border area, the wiring areas, the at least one through hole area and the at least one blind hole area, the at least one insulating layer to be processed including a first insulating layer to be processed, a second insulating layer to be processed and an interlayer insulating layer to be processed; and
a semiconductor layer located in the display area and the hole border area;
forming a planarization layer to be processed on a side of the driving circuit layer to be processed away from the initial base substrate, the planarization layer to be processed being located in the display area, the hole border area, the wiring areas, the at least one through hole area, and the at least one blind hole area;
forming a light-emitting device layer on a side of the planarization layer to be processed away from the initial base substrate, the light-emitting device layer being at least located in the display area and the hole border area;
forming an encapsulation layer to be processed on a side of the light-emitting device layer away from the initial base substrate, the encapsulation layer to be processed being located in the display area, the hole border area, the wiring areas, the at least one through hole area and the at least one blind hole area; and
removing portions, located in the at least one through hole area, of the initial base substrate, the driving circuit layer to be processed, the planarization layer to be processed, and the encapsulation layer to be processed, so as to form a base substrate, a driving circuit layer, a planarization layer, and an encapsulation layer, wherein
forming the driving circuit layer to be processed on the initial base substrate, includes:
forming the semiconductor layer on the initial base substrate;
forming the first insulating layer to be processed on a side of the semiconductor layer away from the initial base substrate;
forming the first gate layer on a side of the first insulating layer to be processed away from the initial base substrate;
forming the second insulating layer to be processed on a side of the first gate layer away from the initial base substrate;
forming the second gate layer on a side of the second insulating layer to be processed away from the initial base substrate;
forming the interlayer insulating layer to be processed on a side of the second gate layer away from the initial base substrate;
forming the source-drain metal layer to be processed on a side of the interlayer insulating layer to be processed away from the initial base substrate;
wherein the initial base substrate further has at least one encapsulation dam area, each encapsulation dam area being located between a through hole area of the at least one through hole area and the wiring area of the at least two wiring areas surrounding the through hole area, and surrounding the through hole area of the at least one through hole area, wherein the at least one insulating layer to be processed is further located in the at least one encapsulation dam area; and
the method further comprises:
forming one or more encapsulation dams, wherein each encapsulation dam area is provided with at least one encapsulation dam therein, the encapsulation dam surrounds the through hole area of the at least one through hole area, and the encapsulation dam is disposed on a side of the driving circuit layer to be processed away from the initial base substrate, wherein the at least one encapsulation dam includes one encapsulation dam; or the at least one encapsulation dam includes at least two encapsulation dams, the at least two encapsulation dams are disposed along a radial direction of the through hole area of the at least one through hole area at intervals in sequence.

* * * * *

UNITED STATES PATENT AND TRADEMARK OFFICE
CERTIFICATE OF CORRECTION

PATENT NO. : 12,408,522 B2  
APPLICATION NO. : 17/619603  
DATED : September 2, 2025  
INVENTOR(S) : Yang Zhou et al.

Page 1 of 1

It is certified that error appears in the above-identified patent and that said Letters Patent is hereby corrected as shown below:

On the Title Page

After item (86), add item (30):  
Foreign Application Priority Data  
April 8, 2020 (CN) ................ PCT/CN2020/083829

Signed and Sealed this  
Second Day of December, 2025

John A. Squires  
*Director of the United States Patent and Trademark Office*